US011296257B2

(12) United States Patent
Lyu

(10) Patent No.: US 11,296,257 B2
(45) Date of Patent: Apr. 5, 2022

(54) LIGHT-EMITTING DIODE CHIP AND PREPARATION METHOD THEREFOR

(71) Applicant: HUAWEI TECHNOLOGIES CO., LTD., Shenzhen (CN)

(72) Inventor: Quan Lyu, Ipswich (GB)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 30 days.

(21) Appl. No.: 17/004,958

(22) Filed: Aug. 27, 2020

(65) Prior Publication Data

US 2020/0395507 A1    Dec. 17, 2020

Related U.S. Application Data

(63) Continuation of application No. PCT/CN2018/098389, filed on Aug. 2, 2018.

(30) Foreign Application Priority Data

Feb. 28, 2018 (CN) .......................... 201810168757.X

(51) Int. Cl.
*H01L 33/06* (2010.01)
*H01L 33/32* (2010.01)
(Continued)

(52) U.S. Cl.
CPC .......... *H01L 33/32* (2013.01); *H01L 33/0075* (2013.01); *H01L 33/0093* (2020.05);
(Continued)

(58) Field of Classification Search
CPC ..... H01L 33/0093; H01L 33/32; H01L 33/06; H01L 33/12; H01L 27/153;
(Continued)

(56) References Cited

U.S. PATENT DOCUMENTS 5,952,681 A    9/1999  Chen
7,449,789 B2 *  11/2008  Chen ................. G02F 1/133603
257/791
(Continued)

FOREIGN PATENT DOCUMENTS

CN        1790756 A      6/2006
CN      101771028 A      7/2010
(Continued)

OTHER PUBLICATIONS

Chinese Notification to Grant issued in corresponding Chinese Application No. 201810168757, dated Jul. 6, 2020, The State Intellectual Property Office of People's Republic of China, Beijing, China.
(Continued)

*Primary Examiner* — Savitri Mulpuri
(74) *Attorney, Agent, or Firm* — Hauptman Ham, LLP

(57) ABSTRACT

Embodiments of this application disclose a light-emitting diode chip and a preparation method therefor. The chip includes: an N-type GaN doping layer; three sub-pixel structures respectively formed in three sub-pixel regions at a first surface of the N-type GaN doping layer, where each of the three sub-pixel structures includes a blue-light quantum well structure, an interface barrier layer, a green-light quantum well structure, a charge barrier layer, and a P-type GaN doping layer that grow in sequence; three P-type contact electrodes respectively formed on the three sub-pixel structures, and an N-type contact electrode formed in a remaining region other than the three sub-pixel regions at the first surface of the N-type GaN doping layer; and a red-light colloidal quantum dot structure formed in a region that corresponds to a first sub-pixel region in the three sub-pixel regions and that is at a second surface of the N-type GaN doping layer.

15 Claims, 15 Drawing Sheets

(51) Int. Cl.
 *H01L 33/36* (2010.01)
 *H01L 33/38* (2010.01)
 *H01L 33/00* (2010.01)
 *H01L 33/12* (2010.01)

(52) U.S. Cl.
 CPC .......... *H01L 33/0095* (2013.01); *H01L 33/06* (2013.01); *H01L 33/12* (2013.01); *H01L 33/382* (2013.01); *H01L 2933/0016* (2013.01); *H01L 2933/0066* (2013.01)

(58) Field of Classification Search
 CPC ............ H01L 33/0095; H01L 33/0075; H01L 33/382; H01L 2933/0066; H01L 33/502; H01L 2933/0041; H01L 33/08; H01L 2933/0016; H01L 25/0753; H01L 33/38
 See application file for complete search history.

(56) References Cited

U.S. PATENT DOCUMENTS

| | | | |
|---|---|---|---|
| 9,159,700 | B2 | 10/2015 | Sakariya et al. |
| 9,557,954 | B2 | 1/2017 | Jepsen et al. |
| 2009/0033204 | A1 | 2/2009 | Wang et al. |
| 2017/0012026 | A1 | 1/2017 | Choi |
| 2017/0213868 | A1 | 7/2017 | Damilano et al. |
| 2017/0338277 | A1 | 11/2017 | Banna et al. |
| 2020/0127173 | A1 | 4/2020 | Park et al. |
| 2020/0152841 | A1* | 5/2020 | Han .................. H01L 25/0753 |

FOREIGN PATENT DOCUMENTS

| | | |
|---|---|---|
| CN | 101800273 A | 8/2010 |
| CN | 102231422 A | 11/2011 |
| CN | 104617121 A | 5/2015 |
| CN | 105679196 A | 6/2016 |
| CN | 105977350 A | 9/2016 |
| CN | 106353920 A | 1/2017 |
| CN | 106356463 A | 1/2017 |
| CN | 106920790 A | 7/2017 |
| CN | 107203064 A | 9/2017 |
| WO | 2010123814 A1 | 10/2010 |
| WO | 2016079505 A1 | 5/2016 |
| WO | 2017160119 A1 | 9/2017 |

OTHER PUBLICATIONS

Chinese First Office Action issued in corresponding Chinese Application No. 201810168757, dated Dec. 30, 2019, The State Intellectual Property Office of People's Republic of China, Beijing, China.
International Search Report issued in corresponding International Application No. PCT/CN2018/098389, dated Dec. 3, 2018, The State Intellectual Property Office of People's Republic of China, Beijing, China.
European Search Report issued in corresponding European Application No. 18908112.8, dated Mar. 12, 2021, pp. 1-5, European Patent Office, Munich, Germany.

* cited by examiner

LIGHT-EMITTING DIODE CHIP AND PREPARATION METHOD THEREFOR

CROSS-REFERENCE TO RELATED APPLICATIONS

This application is a continuation of International Application No. PCT/CN2018/098389, filed on Aug. 2, 2018, which claims priority to Chinese Patent Application No. 201810158757.X, filed on Feb. 28, 2018, The disclosures of the aforementioned applications are hereby incorporated by reference in their entireties.

TECHNICAL FIELD

This application relates to the field of semiconductor technologies, and in particular, to a light-emitting diode chip and a preparation method therefor.

BACKGROUND

As an optoelectronic device, a gallium nitride (GaN)-based light-emitting diode (LED) is widely applied in many display fields such as micro projection display, head-mounted display, augmented reality (AR), virtual reality (VR), and wearable display due to advantages such as a long service fife, high stability, and low power consumption.

Currently, a size of a GaN-based LED chip may be controlled in a micron dimension. If the GaN-based LED chip in the micron dimension is used as a display pixel, a light and thin display system with high resolution and low power consumption may be implemented.

With the development of display technologies, there are new requirements for resolution, color, and the like of a display pixel. How to implement full-color display by using the GaN-based. LED chip becomes an urgent problem to be resolved.

SUMMARY

Embodiments of this application provide an LED chip and a preparation method therefor, to implement full-color display.

According to a first aspect, an embodiment of this application provides a light-emitting diode LED chip. The LED chip includes:

an N-type gallium nitride GaN doping layer;

three sub-pixel structures respectively formed in three sub-pixel regions at a first surface of the N-type GaN doping layer, where each of the three sub-pixel structures includes a blue-light quantum well structure, an interface barrier layer, a green-light quantum well structure, a charge barrier layer, and a P-type GaN doping layer that grow in sequence;

three P-type contact electrodes respectively formed on the three sub-pixel structures, and an N-type contact electrode formed in a remaining region other than the three sub-pixel regions at the first surface of the N-type GaN doping layer; and a red-light colloidal quantum dot structure formed in a region that corresponds to a first sub-pixel region in the three sub-pixel regions and that is at a second surface of the N-type GaN doping layer.

In the foregoing solution, because each of the three sub-pixel structures includes the blue-light quantum well structure and the green-light quantum well structure, the LED chip may emit blue light and green light by using the other two sub-pixel structures other than the first sub-pixel structure in the three sub-pixel structures. In addition, the red-light colloidal quantum dot structure may be used for coating in the region corresponding to the first sub-pixel structure that includes the blue-light quantum well structure and the green-light quantum well structure. In this way, blue light and green light are absorbed and then converted into red light by using the red-light colloidal quantum dot structure, and the LED chip emits red light. Therefore, full-color display can be implemented by using the LED chip provided in the first aspect.

In the LED chip provided in the first aspect, the N-type GaN doping layer may be a GaN layer doped with silicon, and the P-type GaN doping layer may be a GaN layer doped with magnesium.

For a micro display chip, a shape of a pixel may be a circle or a square. Therefore, the three sub-pixel regions may all be circular regions, or may all be square regions. In addition, a size of the sub-pixel region may be set based on different requirements for the LED chip. This is not specifically limited in this embodiment of this application. For example, a diameter of a circular region may be 5 µm to 50 µm.

In a possible design, the blue-light quantum well structure includes N blue-light quantum well layers, and N+1 isolation layers that are used to isolate the N blue-light quantum well layers and that are alternately formed with the N blue-light quantum well layers, where N≥1.

In other words, the blue-light quantum well structure is formed by alternately growing the isolation layer and the blue-light quantum well layer. Generally, the blue-light quantum well structure may be formed through three to five cycles of material growth processes. For example, the blue-light quantum well structure may include two blue-light quantum well layers and three isolation layers that are alternately formed with the two blue-light quantum well layers.

The blue-light quantum well layer may be a GaN layer doped with indium.

In a possible design, the green-light quantum well structure includes M green-light quantum well layers, and M+1 isolation layers that are used to isolate the M green-light quantum well layers and that are alternately formed with the NI green-light quantum well layers, where M≥1.

In other words, the green-light quantum well structure is formed by alternately growing the isolation layer and the green-light quantum well layer. Generally, the green-light quantum well structure may be formed through three to five cycles of material growth processes. For example, the green-light quantum well structure may include two green-light quantum well layers and three isolation layers that are alternately formed with the two green-light quantum well layers.

The green-light quantum well layer may be a GaN layer doped with indium. A proportion of indium doped in the green-light quantum well layer is different from a proportion of indium doped in the blue-light quantum well layer.

To better implement display of three types of color light (namely, red light, blue light, and green light) of the LED chip and improve color purity, the LED chip may further include: a red light filter disposed on the red-light colloidal quantum dot structure; a blue light filter disposed in a region that corresponds to a second sub-pixel region in the three sub-pixel regions and that is at the second surface of the N-type GaN doping layer; and a green light filter disposed in a region that corresponds to a third sub-pixel region in the three sub-pixel regions and that is at the second surface of the N-type GaN doping layer.

In the foregoing solution, the red light filter disposed on red-light colloidal quantum dot structure can be used to filter out color light (for example, blue light and green light) other than red light in the first sub-pixel region. The blue light filter disposed in the region corresponding to the second sub-pixel region can be used to filter out color light (for example, green light) other than blue light in the second sub-pixel region. The green light filter disposed in the region corresponding to the third sub-pixel region can be used to filter out color light (for example, blue light) other than green light in the third sub-pixel region.

In a possible design, the LED chip further includes a drive circuit connected to the three P-type contact electrodes and the N-type contact electrode.

The drive circuit may control luminous intensity of each sub-pixel structure by using a pulse-width modulation technology, so that blue light, green light, and red light emitted by all the sub-pixel structures in the LED chip have same color brightness.

When the LED chip provided in the first aspect is prepared, materials need to be grown on a substrate and a buffer layer. After the material growth is completed, cleavage may be performed on the substrate and the buffer layer because functions of the substrate and the buffer layer have been completed. Certainly, because the substrate and the buffer layer do not affect light-emitting display of the LED chip, cleavage may not be performed on the substrate and the buffer layer.

In a possible design, if cleavage is not performed on the substrate and the buffer layer, the LED chip further includes: a buffer layer and a substrate that are formed at the second surface of the N-type GaN doping layer, where the buffer layer is adjacent to the N-type GaN doping layer, and the substrate is adjacent to the buffer layer and the red-light colloidal quantum dot structure.

According to a second aspect, an embodiment of this application provides a preparation method for an LED chip. The method includes the following steps:

sequentially growing a buffer layer, an N-type GaN doping layer, a blue-light quantum well structure, an interface barrier layer, a green-light quantum well structure, a charge barrier layer; and a P-type GaN doping layer at a first surface of a substrate, to form a first sample;

transferring a mask pattern to the P-type GaN doping layer; to form a second sample, where the mask pattern includes a plurality of sub-pixel regions and a remaining region other than the plurality of sub-pixel regions;

performing etching on the second sample based on the mask pattern, protecting structures in the plurality of sub-pixel regions, and exposing the N-type GaN doping layer in the remaining region, to form a third sample;

respectively forming a plurality of P-type contact electrodes in the plurality of sub-pixel regions in the third sample, and forming an N-type contact electrode in the remaining region, to form a fourth sample; and respectively using at least one red-light colloidal quantum dot structure for coating in a region that is at a second surface of the substrate and that corresponds to at least one first sub-pixel region in the plurality of sub-pixel regions that is used to emit red light, to form an LED chip.

In a possible design, the method further includes: respectively disposing at least one red light filter on the at least one red-light colloidal quantum dot structure; respectively disposing at least one blue light filter in a region that is at the second surface of the substrate and that corresponds to at least one second sub-pixel region in the plurality of sub-pixel regions that is used to emit blue light; and respectively disposing at least one green light filter in a region that is at the second surface of the substrate and that corresponds to at least one third sub-pixel region in the plurality of sub-pixel regions that is used to emit green light.

In a possible design, the method further includes: connecting a drive circuit to the plurality of P-type contact electrodes and the N-type contact electrode through alignment by using a metal solder ball.

In a possible design, before the respectively using at least one red-light colloidal quantum dot structure for coating, cleavage may be further performed between the LED chip and each of the substrate and the buffer layer in a laser radiation manner. In this case, the respectively using at least one red-light colloidal quantum dot structure for coating in a region that is at a second surface of the substrate and that corresponds to at least one first sub-pixel region in the plurality of sub-pixel regions that is used to emit red light may be specifically implemented in the following manner: respectively using the at least one red-light colloidal quantum dot structure for coating in the region that is at the surface of the N-type GaN doping layer adjacent to the buffer layer and that corresponds to the at least one first sub-pixel region.

In a possible design, the performing etching on the second sample based on the mask pattern, protecting structures in the plurality of sub-pixel regions, and exposing the N-type GaN doping layer in the remaining region other than the plurality of sub-pixel regions in the mask pattern may be specifically implemented in the following manner: passivating and protecting a side surface of the LED chip and the plurality of sub-pixel regions; and performing etching on the remaining region by using inductively coupled plasma ICP or through reactive ion etching RIE, so that the N-type GaN doping layer in the remaining region is exposed.

In a possible design, the respectively forming a plurality of P-type contact electrodes in the plurality of sub-pixel regions, and forming an N-type contact electrode in the remaining region may be specifically implemented in the following manner: evaporating and depositing a gold-nickel alloy by using an electron beam, and respectively forming the plurality of P-type contact electrodes in the plurality of sub-pixel regions after annealing at 200° C. to 500° C._ and sputtering indium tin oxide ITO or graphite in the remaining region, to form the N-type contact electrode.

According to a third aspect, an embodiment of this application provides a light-emitting diode LED chip. The LED chip includes:

an N-type gallium nitride GaN doping layer;

three sub-pixel structures respectively formed in three sub-pixel regions at a first surface of the N-type GaN doping layer, where a first sub-pixel structure in a first sub-pixel region of the three sub-pixel regions includes a blue-light quantum well structure or a green-light quantum well structure, a charge barrier layer, and a P-type GaN doping layer that grow in sequence; a second sub-pixel structure in a second sub-pixel region of the three sub-pixel regions includes a blue-light quantum well structure, a charge barrier layer, and a P-type GaN doping layer that grow in sequence; and a third sub-pixel structure in a third sub-pixel region of the three sub-pixel regions includes a green-light quantum well structure, a charge barrier layer, and a P-type GaN doping layer that grow in sequence;

three P-type contact electrodes respectively formed on the three s structures; and an N-type contact electrode formed in a remaining region other than the three sub-pixel regions at the first surface of the N-type GaN doping layer; and a red-light colloidal quantum dot structure formed in a region that corresponds to the first sub-pixel region and that is at a second surface of the N-type GaN doping layer.

In the foregoing solution, because the second sub-pixel structure in the three sub-pixel structures includes the blue-light quantum well structure, the LED chip can emit blue light by using the second sub-pixel structure; and because the third sub-pixel structure in the three sub-pixel structures includes the green-light quantum well structure, the LED chip can emit green light by using the third sub-pixel structure. In addition, the red-light colloidal quantum dot structure may be used for coating in the region corresponding to the first sub-pixel structure that includes the blue-light quantum well structure or the green-light quantum well structure. In this way, blue light or green light is absorbed and then converted into red light by using the red-light colloidal quantum dot structure, and the LED chip emits red light. Therefore, full-color display can be implemented by using the LED chip provided in the third aspect.

In the LED chip provided in the third aspect, the N-type GaN doping layer may be a GaN layer doped with silicon; and the P-type GaN doping layer in the first sub-pixel structure, the P-type GaN doping layer in the second sub-pixel structure, and the P-type GaN doping layer in the third sub-pixel structure each may be a GaN layer doped with magnesium.

For a micro display chip, a shape of a pixel may be a circle or a square. Therefore, the three sub-pixel regions may all be circular regions, or may all be square regions. In addition, a size of the sub-pixel region may be set based on different requirements for the LED chip. This is not specifically limited in this embodiment of this application. For example, a diameter of a circular region may be 5 μm to 50 μm.

In a possible design, the blue-light quantum well structure in the second sub-pixel structure includes N blue-light quantum well layers, and N+1 isolation layers that are used to isolate the N blue-light quantum well layers and that are alternately formed with the N blue-light quantum well layers, where N≥1.

In other words, the blue-light quantum well structure in the second sub-pixel structure is formed by alternately growing the isolation layer and the blue-light quantum well layer Generally, the blue-light quantum well structure in the second sub-pixel structure may be formed through three to five cycles of material growth processes. For example, the blue-light quantum well structure in the second sub-pixel structure may include two blue-light quantum well layers and three isolation layers that are alternately formed with the two blue-light quantum well layers.

The blue-light quantum well layer in the second sub-pixel structure may be a GaN layer doped with indium.

In addition, if the first sub-pixel structure includes the blue-light quantum well structure, a structure of the blue-light quantum well structure in the first sub-pixel structure may be the same as that of the blue-light quantum well structure in the second sub-pixel structure.

In a possible design, the green-light quantum well structure in the third sub-pixel structure includes M green-light quantum well layers, and M+1 isolation layers that are used to isolate the M green-light quantum well layers and that are alternately formed with the M green-light quantum well layers, where M≥1.

In other words, the green-light quantum well structure in the third sub-pixel structure is formed by alternately growing the isolation layer and the green-light quantum well layer. Generally, the green-light quantum well structure in the third sub-pixel structure may be formed through three to five cycles of material growth processes. For example, the green-light quantum well structure in the third sub-pixel structure may include two green-light quantum well layers and three isolation layers that are alternately formed with the two green-light quantum well layers.

The green-light quantum well layer in the third sub-pixel structure may be a GaN layer doped with indium. A proportion of indium doped in the green-light quantum well layer in the third sub-pixel structure is different from a proportion of indium doped in the blue-light quantum well layer in the second sub-pixel structure.

In addition, if the first sub-pixel structure includes the green-light quantum well structure, a structure of the green-light quantum well structure in the first sub-pixel structure may be the same as that of the green-light quantum well structure in the third sub-pixel structure.

To better implement display of three types of color light (namely, red light, blue light, and green light) of the LED chip and improve color purity, the LED chip may further include: a red light filter disposed on the red-light colloidal quantum dot structure; a blue light filter disposed in a region that corresponds to the second sub-pixel region and that is at the second surface of the N-type GaN doping layer; and a green light filter disposed in a region that corresponds to the third sub-pixel region and that is at the second surface of the N-type GaN doping layer.

In the foregoing solution, the red light filter disposed on the red-light colloidal quantum dot structure can be used to filter out color light (for example, blue light and green light) other than red light in the first sub-pixel region. The blue light filter disposed in the region corresponding to the second sub-pixel region can be used to filter out color light (for example, green light) other than blue light in the second sub-pixel region. The green light filter disposed in the region corresponding to the third sub-pixel region can be used to filter out color light (for example, blue light) other than green light in the third sub-pixel region.

In a possible design, the LED chip further includes a drive circuit connected to the three P-type contact electrodes and the N-type contact electrode.

The drive circuit may control luminous intensity of each sub-pixel structure by using a pulse-width modulation technology, so that blue light, green light, and red light emitted by all the sub-pixel structures in the LED chip have same color brightness.

When the LED chip provided in the third aspect is prepared, materials need to be grown on a substrate and a buffer layer. After the material growth is completed, cleavage may be performed on the substrate and the buffer layer because functions of the substrate and the buffer layer have been completed. Certainly, because the substrate and the buffer layer do not affect light-emitting display of the LED chip, cleavage may not be performed on the substrate and the buffer layer.

In a possible design, if cleavage is not performed on the substrate and the buffer layer, the LED chip further includes: a buffer layer and a substrate that are formed at the second surface of the N-type GaN doping layer, where the buffer layer is adjacent to the N-type GaN doping layer, and the substrate is adjacent to the buffer layer and the red-light colloidal quantum dot structure.

According to a fourth aspect, an embodiment of this application provides a preparation method for a light-emitting dioxide LED chip. The method includes the following steps:

sequentially growing a buffer layer and an N-type GaN doping layer at a first surface of a substrate;

sequentially growing a blue-light quantum well structure, a charge barrier layer, and a P-type GaN doping layer in a blue-light quantum well growth region at the N-type GaN doping layer, and sequentially growing a green-light quantum well structure, a charge barrier layer, and a P-type GaN doping layer in a green-light quantum well growth region other than the blue-light quantum well growth region at the N-type GaN doping layer, to form a first sample; and transferring a mask pattern to the P-type GaN doping layer, to form a second sample; where the mask pattern includes a plurality of sub-pixel regions and a remaining region other than the plurality of sub-pixel regions, the plurality of sub-pixel regions include at least one first sub-pixel region used to emit red light, at least one second sub-pixel region used to emit blue light, and at least one third sub-pixel region used to emit green light, the at least one first sub-pixel region is aligned with the blue-light quantum well growth region or the green-light quantum well growth region, the at least one second sub-pixel region is aligned with the blue-light quantum well growth region, and at least one third sub-pixel region is aligned with the green-light quantum well growth region;

performing etching on the second sample based on the mask pattern, protecting structures in the plurality of sub-pixel regions, and exposing the N-type GaN doping layer in the remaining region, to form a third sample;

respectively forming a plurality of P-type contact electrodes in the plurality of sub-pixel regions in the third sample, and forming an N-type contact electrode in the remaining region, to form a fourth sample; and using at least one red-light colloidal quantum dot structure for coating in a region that is at a second surface of the substrate and that corresponds to the at least one first sub-pixel region, to form an LED chip.

In a possible design, the sequentially growing a blue-light quantum well structure, a charge barrier layer, and a P-type GaN doping layer in a blue-light quantum well growth region at the N-type GaN doping layer, and sequentially growing a green-light quantum well structure, a charge barrier layer, and a P-type GaN doping layer in a green-light quantum well growth region other than the blue-light quantum well growth region at the N-type GaN doping layer may be specifically implemented in the following manner: preparing a first mask at the N-type GaN doping layer, where the first mask is used to protect the green-light quantum well growth region; sequentially growing the blue-light quantum well structure, the charge barrier layer, and the P-type GaN doping layer in the blue-light quantum well growth region; removing the first mask; preparing a second mask in the blue-light quantum well growth region, where the second mask is used to protect the blue-light quantum well growth region; and sequentially growing the green-light quantum well structure, the charge barrier layer, and the P-type GaN doping layer in the green-light quantum well growth region.

In a possible design, the method further includes: respectively disposing at least one red light filter on the at least one red-light colloidal quantum dot structure; respectively disposing at least one blue light filter in a region that is at the second surface of the substrate and that corresponds to the at least one second sub-pixel region; and respectively disposing at least one green light filter in a region that is at the second surface of the substrate and that corresponds to the at least one third sub-pixel region.

In a possible design, the method further includes: connecting a drive circuit to the plurality of P-type contact electrodes and the N-type contact electrode through alignment by using a metal solder ball.

In a possible design, before the respectively using at least one red-light colloidal quantum dot structure for coating, cleavage may be further performed between the LED chip and each of the substrate and the buffer layer in a laser radiation manner. In this case, the respectively using at least one red-light colloidal quantum dot structure for coating in a region that is at a second surface of the substrate and that corresponds to at least one first sub-pixel region may be implemented in the following manner: respectively using the at least one red-light colloidal quantum dot structure for coating in the region that is at the surface of the N-type GaN doping layer adjacent to the buffer layer and that corresponds to the at least one first sub-pixel region.

In a possible design, the performing etching on the second sample based on the mask pattern, protecting structures in the plurality of sub-pixel regions, and exposing the N-type GaN doping layer in the remaining region other than the plurality of sub-pixel regions in the mask pattern may be specifically implemented in the following manner: passivating and protecting a side surface of the LED chip and the plurality of sub-pixel regions; and performing etching on the remaining region by using inductively coupled plasma ICP or through reactive ion etching RIE, so that the N-type GaN doping layer in the remaining region is exposed.

In a possible design, the respectively forming a plurality of P-type contact electrodes in the plurality of sub-pixel regions, and forming an N-type contact electrode in the remaining region may be specifically implemented in the following manner: evaporating and depositing a gold-nickel alloy by using an electron beam, and respectively forming the plurality of P-type contact electrodes in the plurality of sub-pixel regions after annealing at 200° C. to 500° C.; and sputtering indium tin oxide ITO or graphite in the remaining region, to form the N-type contact electrode.

In addition, it should be noted that for technical effects brought by any one of the possible designs of the second aspect, reference may be made to technical effects brought by different designs of the first aspect; and for technical effects brought by any one of the possible designs of the fourth aspect, reference may be made to technical effects brought by different design manners of the third aspect. Details are not described herein again.

DESCRIPTION OF EMBODIMENTS

Generally, when a GaN-based LED chip for full-color display is prepared, the following method is used: sequentially growing a buffer layer and an N-type doping layer on a substrate, and then growing a sub-pixel structure in each sub-pixel region of the N-type doping layer, where each sub-pixel structure sequentially includes three colors of quantum well structures (that is, a blue-light quantum well structure, a green-light quantum well structure, and a red-light quantum well structure), a charge barrier layer, and a P-type doping layer. Then, an N-type contact electrode and a P-type contact electrode are prepared.

Figure 1:
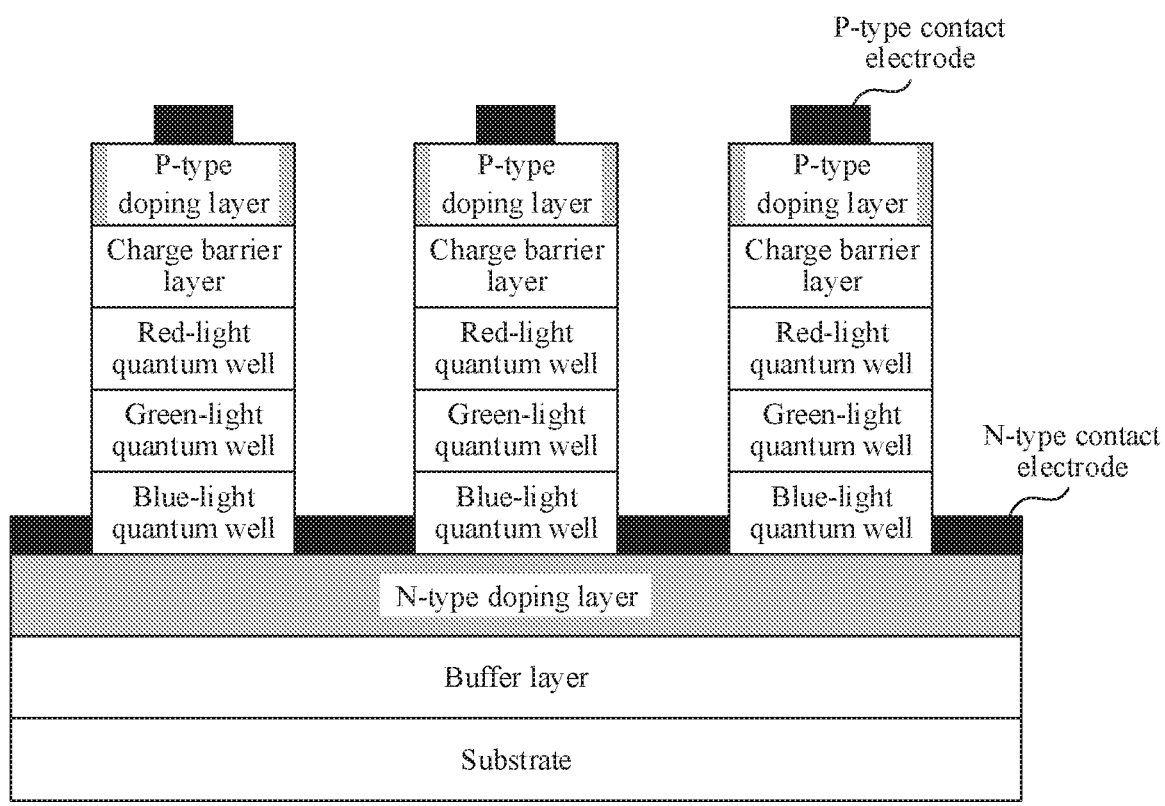
FIG. 1 is a schematic structural diagram of a first GaN-based LED chip according to an embodiment of this application.

A structure of an LED chip prepared by using the foregoing method may be shown in FIG. 1. It should be noted that the LED chip shown in FIG. 1 shows only three sub-pixel structures grown in three sub-pixel regions. The three sub-pixel structures are respectively used to emit blue light, green light, and red light. In actual implementation, the LED chip may include a plurality of sub-pixel structures, each sub-pixel structure may be used as one sub-pixel of the LED chip for full-color display, and every three sub-pixel structures in the plurality of sub-pixel structures may be used as one pixel of the LED chip for full-color display.

The following describes a principle of implementing full-color display by using the LED chip shown in FIG. 1.

First, a light-emitting wavelength of the quantum well structure is controlled by changing a proportion of indium (In) doped in the quantum well structure, to implement display of three colors: blue, green, and red. For example, a proportion of In doped in the blue-light quantum well structure is controlled, so that the blue-light quantum well structure can emit blue light when a light emitting wavelength of the blue-light quantum well structure is 450 nm to 480 nm. A proportion of in doped in the green-light quantum well structure is controlled, so that the green-light quantum well structure can emit green light when a light emitting wavelength of the green-light quantum well structure is 500 nm to 550 nm. A proportion of In doped in the red-light quantum well structure is controlled, so that the red-light quantum well structure can emit red light when a light-emitting wavelength of the red-light quantum well structure is 620 nm to 700 nm.

Then, different colors of light filters are disposed on the LED chip, so that different colors of light are emitted by using all the sub-pixel structures. For example, a blue light filter is disposed in a region corresponding to a left-side sub-pixel structure. Because the blue filter can filter out other color light other than blue light, blue light can be emitted in a region above the blue light filter. A green light filter is disposed in a region corresponding to a middle sub-pixel structure. Because the green light filter can filter out other color light other than green light, green light can be emitted in a region above the green light filter. A red light filter is disposed in a region corresponding to a right-side sub-pixel structure. Because the red light filter can filter out other color light other than red light, red light can be emitted in a region above the red light filter.

In the LED chip shown in FIG. 1, a red-light quantum well structure requires a high doping proportion of In. However, excessively doping in may cause defects and misplacement of the red-light quantum well structure. As a result, the finally obtained red-light quantum well structure has low light-emitting efficiency and high power consumption.

To make the objectives, technical solutions and advantages of the embodiments of this application clearer, the following further describes this application in detail with reference to the accompanying drawings.

The embodiments of this application provide an LED chip and a preparation method therefor, to implement full-color display, improve light-emitting efficiency, and reduce power consumption.

In this application, "a plurality of" refers to two or more than two. In addition, it should be understood that, in the description of this application, terms "first" and "second" are merely used for a purpose of distinguishing between descriptions, but cannot be understood as indication or implication of relative importance, and cannot be understood as an indication or implication of a sequence.

Figure 2:
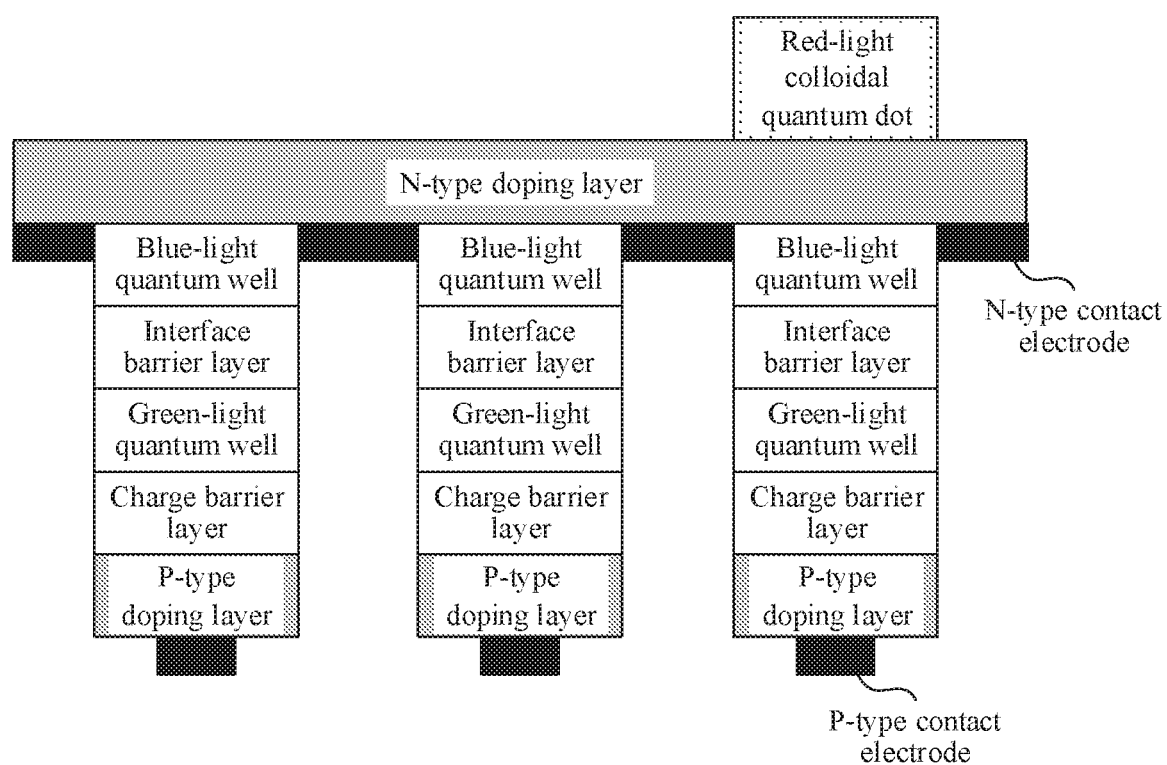
FIG. 2 is a schematic structural diagram of a second GaN-based LED chip according to an embodiment of this application.

The following further illustrates the embodiments of this application in detail with reference to the accompanying drawings of this specification, FIG. 2 is a schematic structural diagram of an LED chip according to an embodiment of this application. The LED chip includes the following four parts:

1. N-type gallium nitride (GaN) doping layer

2. Three sub-pixel structures formed in three sub-pixel regions at a first surface of the N-type GaN doping layer Each of the three sub-pixel structures includes a blue-light quantum well structure, an interface barrier layer, a green-light quantum well structure, a charge barrier layer, and a P-type GaN doping layer that grow in sequence.

3. Three P-type contact electrodes respectively formed on the three sub-pixel structures, and an N-type contact electrode formed in a remaining region other than the three sub-pixel regions at the first surface of the N-type GaN doping layer 4. Red-light colloidal quantum dot structure formed in a region that corresponds to a first sub-pixel region in the three sub-pixel regions and that is at a second surface of the N-type GaN doping layer In this embodiment of this application, a colloidal quantum dot is a chemically synthesized inorganic nonmaterial having a quasi-zero-dimensional structure. A colloidal quantum dot structure can implement absorption and conversion of spectral energy. When absorbing spectral energy, the colloidal quantum dot structure can absorb spectral energy of various short-wavelength color light. During conversion of spectral energy, a light-emitting wavelength of a colloidal quantum dot may be controlled by controlling a size of the colloidal quantum dot structure, so that the colloidal quantum dot emits different colors of light.

The red-light colloidal quantum dot structure may absorb blue light emitted by the blue-light quantum well structure, and/or green light emitted by the green-light quantum well structure. A size of the red-light colloidal quantum dot structure is controlled, so that a light-emitting wavelength of the red-light colloidal quantum dot structure can be a light-emitting wavelength of red light (for example, can be 620 nm to 700 nm). In this case, the red-light colloidal quantum dot structure can emit red light.

In specific implementation, the red-light colloidal quantum dot structure may include a plurality of colloidal quantum dots. Each colloidal quantum dot includes three parts: a core, a shell, and a ligand. A material of the core may be CdSe, CdTe, InP, ZnS, GaAs, HgTe, InGaP, PbS, PbSe, PhTe, InSe, CulnGaS2, GuIn, GaSe2, or the like. A material of the shell may be CdS, ZnS, or ZnSe. A material of the ligand may be siloxane, oleic acid, or the like. In addition, in this embodiment of this application, to improve a water/oxygen blocking capability of the red-light colloidal quantum dot structure and prevent the colloidal quantum dot from being stained, the red-light colloidal quantum dot may be further encapsulated by using epoxy resin.

In this embodiment of this application, the red-light colloidal quantum dot structure is used to absorb blue light and/or green light to emit red light. Therefore, a red-light quantum well structure does not need to be disposed in the LED chip. In this way, there is no defect or misplacement of a red-light quantum well structure due to high doping proportion of in in an existing GaN-based LED chip. In addition, because an emission spectrum of the colloidal quantum dot has characteristics of narrow line width and high photoluminescence fluorescence efficiency, in an LED chip for full-color display, the red-light colloidal quantum dot structure is used to absorb blue light and/or green light to implement red light. In this way, light-emitting efficiency of the LED chip can be improved, thereby reducing power consumption of the LED chip.

In the LED chip shown in FIG. 2, red light may be emitted in a region corresponding to a first sub-pixel structure, by using the disposed red-light colloidal quantum dots. In addition, the other two sub-pixel structures other than the first sub-pixel structure in the three sub-pixel structures also include the blue-light quantum well structure and the green-light quantum well structure. Therefore, blue light and green light may be respectively displayed by using the other two sub-pixel structures.

To better implement display of three types of color light (namely, red light, blue light, and green light) of the LED chip and improve color purity, a light filter may be disposed in a corresponding light-emitting region. In other words, the LED chip shown in FIG. 2 may further include: a red light filter disposed on the red-light colloidal quantum dot structure; a blue light filter disposed in a region that corresponds to a second sub-pixel region in the three sub-pixel regions and that is at the second surface of the N-type GaN doping layer; and a green light filter disposed in a region that corresponds to a third sub-pixel region in the three sub-pixel regions and that is at the second surface of the N-type GaN doping layer.

The second sub-pixel region may be used to emit blue light, and the third sub-pixel region may be used to emit green light. The red light filter disposed on the red-light colloidal quantum dot structure can be used to filter out color light (for example, blue light and green light) other than red light in the first sub-pixel region. The blue light filter disposed in the region corresponding to the second sub-pixel region can be used to filter out color light (for example, green light) other than blue light in the second sub-pixel region. The green light filter disposed in the region corresponding to the third sub-pixel region can be used to filter out color light (for example, blue light) other than green light in the third sub-pixel region.

Figure 3:
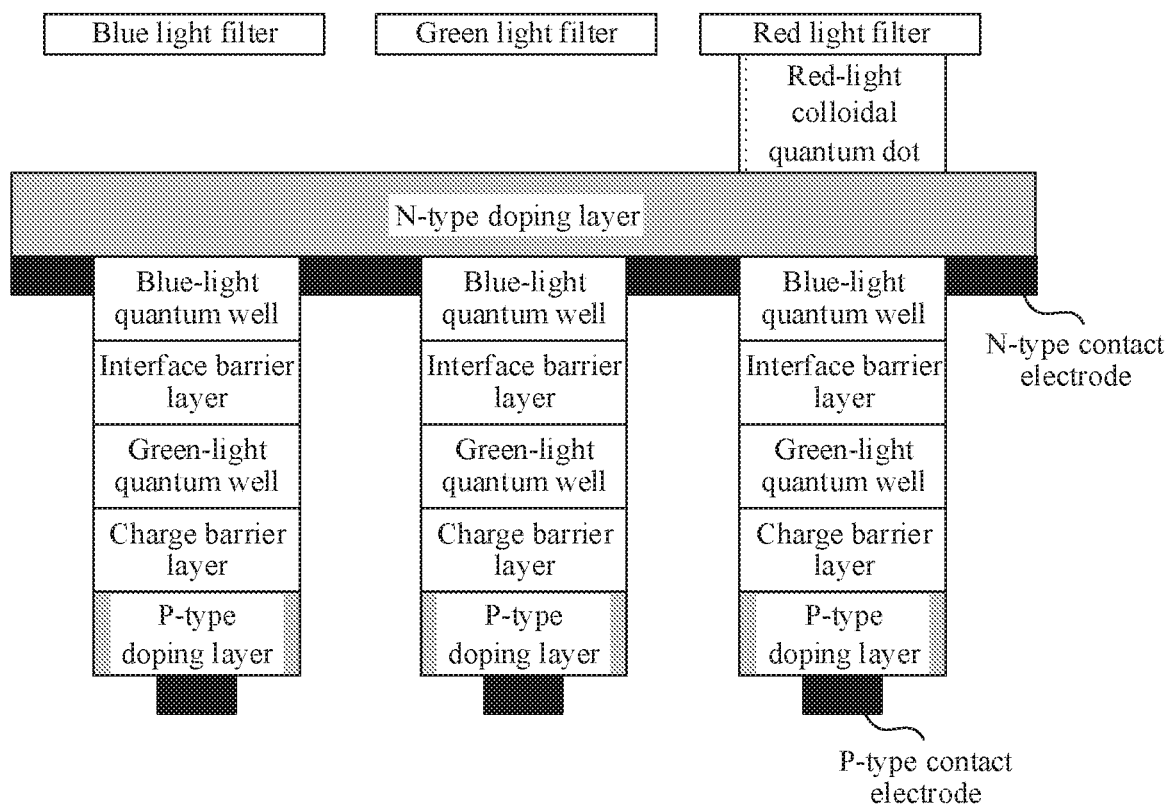
FIG. 3 is a schematic structural diagram of a third GaN-based LED chip according to an embodiment of this application.

After the red light filter, the blue light filter, and the green light filter are disposed, a structure of the LED chip may be shown in FIG. 3. In the LED chip shown in FIG. 3, red light can be emitted in a region above the red light filter, green light can be emitted in a region above the green light filter, and blue light can be emitted in a region above the blue light filter.

In the LED chip shown in FIG. 2, the charge barrier layer can reduce charge leakage of the sub-pixel structure. For example, the charge barrier layer may be made of $Al_{0.15}Ga_{0.85}N$, and a thickness of the charge barrier layer may be 15 nm to 35 nm. The N-type GaN doping layer may be a GaN layer doped with silicon, and a thickness of the N-type GaN doping layer may be 2 μm to 3 μm. The P-type GaN doping layer may be a GaN layer doped with magnesium, and a thickness of the P-type GaN doping layer may be 150 nm to 300 nm.

In addition, the first surface of the N-type GaN doping layer may be divided into the three sub-pixel regions and the remaining region other than the three sub-pixel regions. The three sub-pixel regions are respectively used to form the three sub-pixel structures, and the three sub-pixel structures are respectively used to emit blue light, green light, and red light, to implement full-color display of the LED chip. The three sub-pixel structures may be formed in an etching manner. To be specific, a mask pattern that includes sub-pixel regions and a remaining region through division is prepared, and etching is performed on a structure in the remaining region based on the mask pattern, to form the sub-pixel structures.

Figure 4:
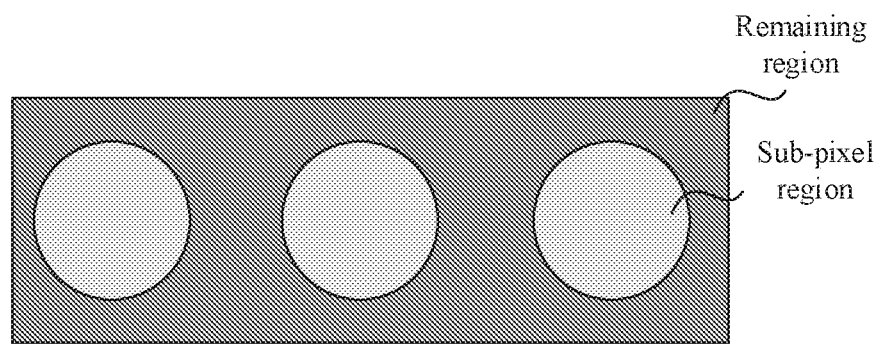
FIG. 4 is a schematic diagram of region division at a first surface of an N-type GaN doping layer according to an embodiment of this application.

It should be noted that, in this embodiment of this application, the sub-pixel region is merely obtained after region division to form the sub-pixel structure, and does not represent any actual structure. For example, when the sub-pixel region is a circular region, region division at the first surface of the N-type GaN doping layer may be shown in FIG. 4. In FIG. 4, a light gray region represents a sub-pixel region, and a dark gray region represents a remaining region other than the three sub-pixel regions at the first surface of the N-type GaN doping layer. It is not difficult to imagine that the sub-pixel structure formed in the sub-pixel region shown in FIG. 4 is a cylindrical structure.

For a micro display chip, a shape of a pixel may be a circle or a square. Therefore, the three sub-pixel regions in this embodiment of this application may all be circular regions, or may all be square regions. In addition, a size of the sub-pixel region may be set based on different requirements for the LED chip. This is not specifically limited in this embodiment of this application. For example, a diameter of a circular region may be 5 μm to 50 μm.

In the LED chip shown in FIG. 2, the blue-light quantum well structure may include N blue-light quantum well layers, and N+1 isolation layers that are used to isolate the N blue-light quantum well layers and that are alternately formed with the N blue-light quantum well layers, where N≥1. Similarly, the green-light quantum well structure may include M green-light quantum well layers, and M+1 isolation layers that are used to isolate the M green-light quantum well layers and that are alternately formed with the M green-light quantum well layers, where M≥1.

In other words, the quantum well structure is formed by alternately growing the isolation layer and the quantum well layer. Generally, the quantum well structure may be formed through three to five cycles of material growth processes. For example, the blue-light quantum well structure may include two blue-light quantum well layers and three isolation layers that are alternately formed with the two blue-light quantum well layers.

The blue-light quantum well layer may be made of GaN doped with In, which may be specifically represented by $In_xGa_{1-x}N$. Similarly, the green-light quantum well layer may be made of GaN doped with In, which may be specifically represented by $In_xGa_{1-x}N$. A difference is that a doping proportion of In in the blue-light quantum well layer is different from that in the green-light quantum well layer, that is, values of x are different. Different doping proportions of In in the quantum well layer indicate different light-emitting wavelengths of the quantum well layer. The light-emitting wavelength of the quantum well layer can be controlled by controlling the doping proportion of In in the quantum well layer. For example, when x=0.15, a light-emitting wavelength of the quantum well layer is 460 nm. In this case, the quantum well layer can be used to emit blue light, that is, the quantum well layer is the blue-light quantum well layer. When x=0.25, a light-emitting wavelength of the quantum well layer is 5300 nm. In this case, the quantum well layer can be used to emit green light, that is, the quantum well layer is the green-light quantum well layer.

In this embodiment of this application, a thickness of the blue-light quantum well layer may be 2 nm to 0.5 nm, and a thickness of the green-light quantum well layer may also be 2 nm to 0.5 nm. The isolation layer may be made of GaN, and a thickness of the isolation layer may be 7 nm to 15 nm.

Figure 5:
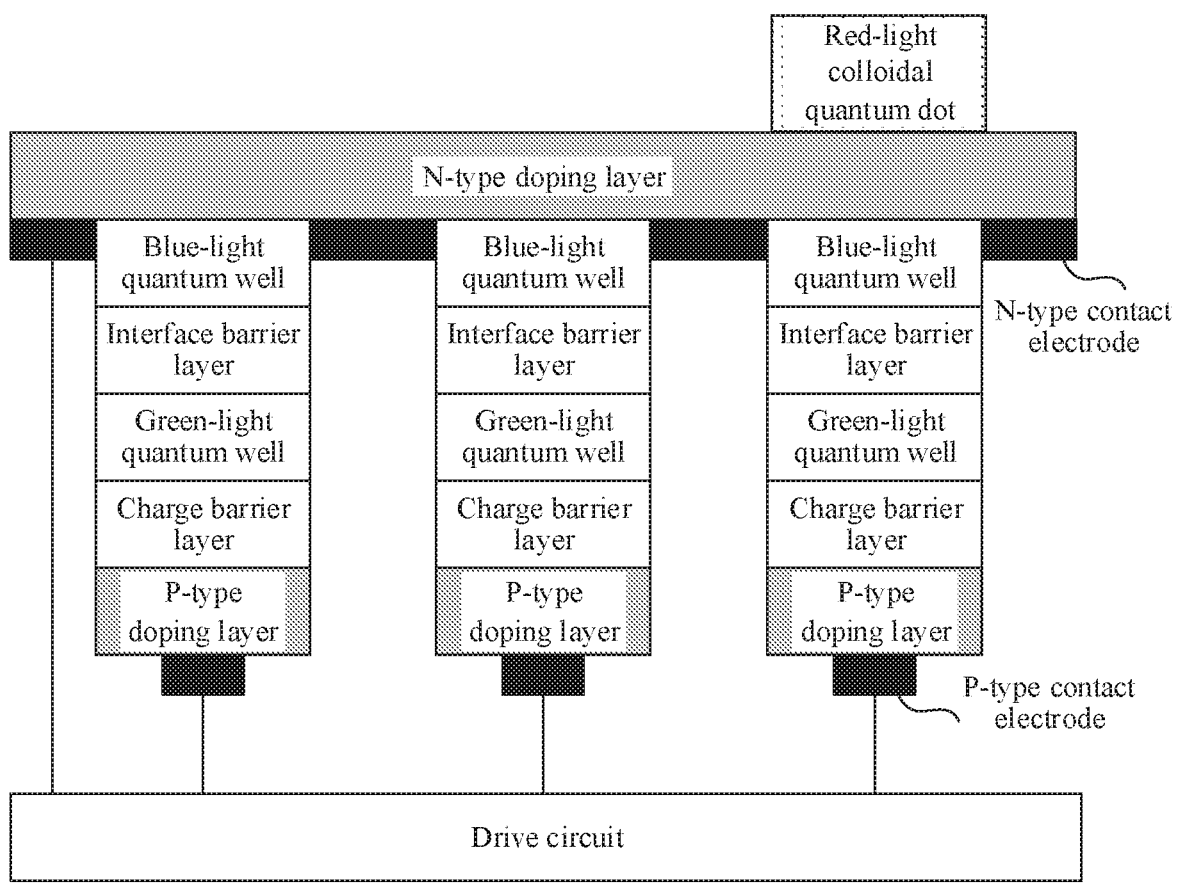
FIG. 5 is a schematic structural diagram of a fourth GaN-based LED chip according to an embodiment of this application.

In addition, as shown in FIG. 5, the LED chip shown in FIG. 2 may further include a drive circuit connected to the three P-type contact electrodes and the N-type contact electrode.

Precise alignment and connection between the drive circuit and the contact electrodes may be implemented by using a metal solder ball. For example, the drive circuit may include a thin film transistor (TFT), low temperature polysilicon (LTPS), a complementary metal-oxide-semiconductor (CMOS), and the like. The drive circuit may control luminous intensity of each sub-pixel structure by using a pulse-width modulation (PWM) technology, so that blue light, green light, and red light emitted by all the sub-pixel structures in the LED chip have same color brightness.

It is well known that when the LED chip is prepared, materials need to be grown on a substrate and a buffer layer. After the material growth is completed, cleavage may be performed on the substrate and the buffer layer because functions of the substrate and the buffer layer have been completed. The LED chip obtained after the cleavage may be shown in FIG. 2, FIG. 3, and FIG. 5. In other words, the LED chip does not include the substrate and the buffer layer. In addition, because the substrate and the buffer layer do not affect light-emitting display of the LED chip, cleavage may not be performed on the substrate and the buffer layer.

Figure 6:
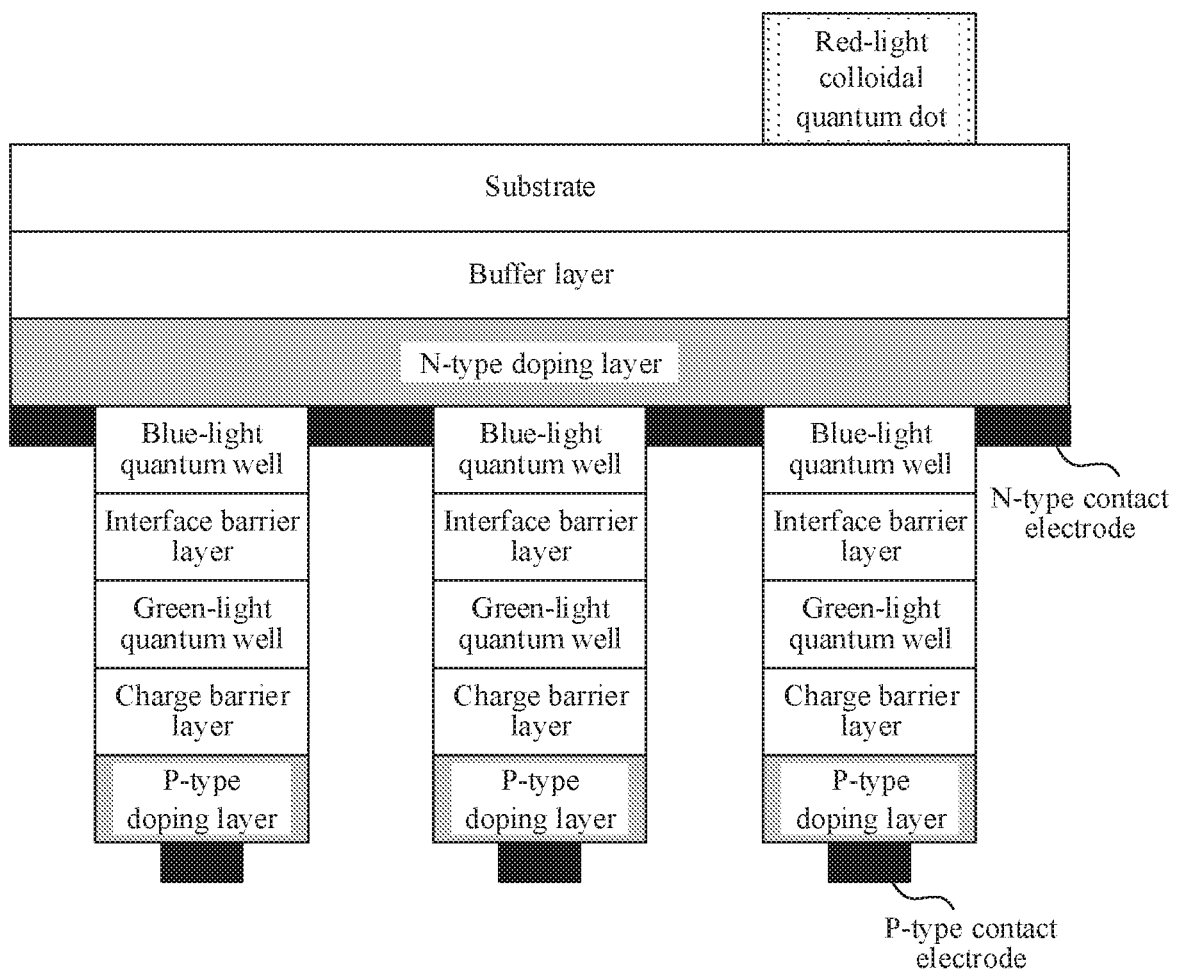
FIG. 6 is a schematic structural diagram of a fifth GaN-based LED chip according to an embodiment of this application.

As shown in FIG. 6, if cleavage is not performed on the substrate and the buffer layer after the material growth is completed, the LED chip further includes: a buffer layer and a substrate that are formed at the second surface of the N-type GaN doping layer. The buffer layer is adjacent to the N-type GaN doping layer, and the substrate is adjacent to the buffer layer and the red-light colloidal quantum dot structure.

In this embodiment of this application, the substrate may be any one of a sapphire substrate, a Si substrate, a SiC substrate, or a GaN substrate; and the buffer layer may be a GaN buffer layer, where a thickness of the buffer layer may be selected from 2 μm to 3 μm.

It should be noted that the LED chip shown in FIG. 2 includes only three sub-pixel structures. In other words, the LED chip includes only one pixel. In actual implementation, the LED chip may include a plurality of sub-pixel structures, and every three of the plurality of sub-pixel structures are a group used as one pixel of the LED chip. A structure of each pixel may be shown in FIG. 2. Each pixel is a basic unit for full-color display of the LED chip.

In conclusion, in the LED chip shown in FIG. 2, because each of the three sub-pixel structures includes a blue-light quantum well structure and a green-light quantum well structure, the LED chip may emit blue light and green light by using the other two sub-pixel structures other than the first sub-pixel structure in the three sub-pixel structures. In addition, the red-light colloidal quantum dot structure may be used for coating in a region corresponding to the first sub-pixel structure. In this way, blue light or green light is absorbed and then converted into red light by using the red-light colloidal quantum dot structure, and the LED chip emits red light. Therefore, full-color display can be implemented by using the LED chip shown in FIG. 2.

In addition, because the red-light colloidal quantum dot structure has characteristics such as narrow line width and high photoluminescence fluorescence efficiency, the red-light colloidal quantum dot structure is used to absorb blue light and green light, to implement a solution in which the LED chip for full-color display emits red light. When the solution is compared with a solution in the prior art in which the LED chip emits red light by using a red-light quantum well structure, the light-emitting efficiency of the LED chip can be improved, thereby reducing power consumption of the LED chip.

Figure 7:
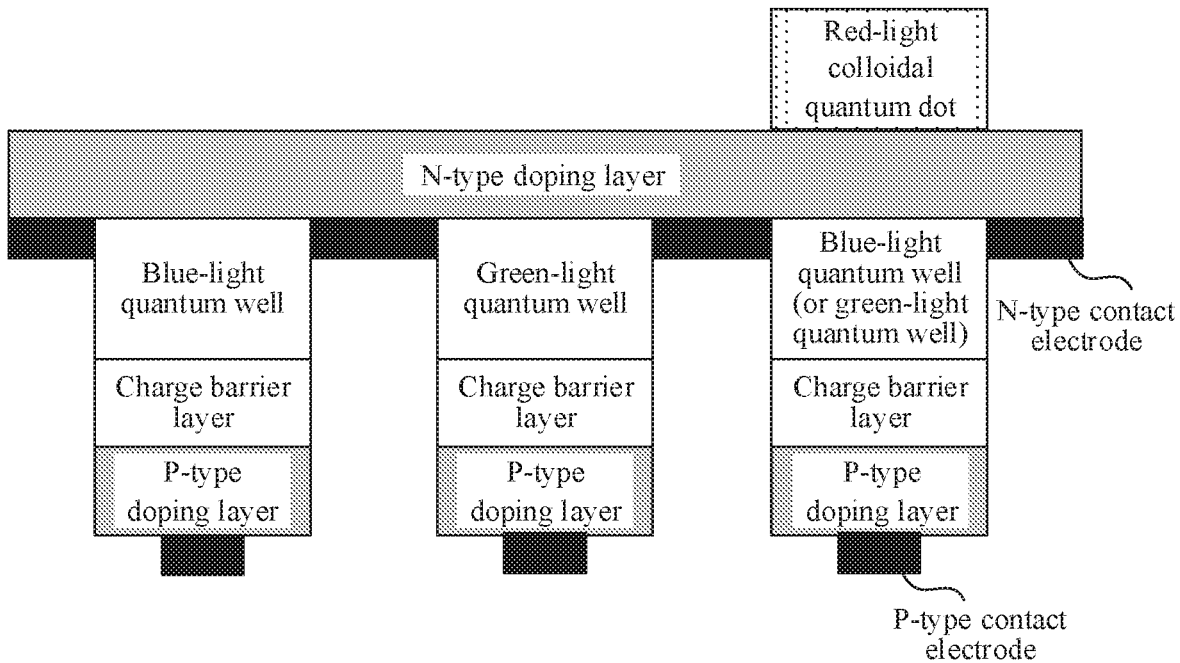
FIG. 7 is a schematic structural diagram of a sixth GaN-based chip according to an embodiment of this application.

In addition, this embodiment of this application further provides another LED chip. As shown in FIG. 7, the LED chip includes the following four parts:

1. N-type gallium nitride GaN doping layer
2. Three sub-pixel structures formed in three sub-pixel regions at a first surface of the N-type GaN doping layer A first sub-pixel structure in a first sub-pixel region of the three sub-pixel regions includes a blue-light quantum well structure or a green-light quantum well structure, a charge barrier layer, and a P-type GaN doping layer that grow in sequence. A second sub-pixel structure in a second sub-pixel region of the three sub-pixel regions includes a blue-light quantum well structure, a charge barrier layer, and a P-type GaN doping layer that grow in sequence. A third sub-pixel structure in a third sub-pixel region of the three sub-pixel regions includes a green-light quantum well structure, a charge barrier layer, and a P-type GaN doping layer that grow in sequence.

3. Three P-type contact electrodes respectively formed on the three sub-pixel structures, and an N-type contact electrode formed in a remaining region other than the three sub-pixel regions at the first surface of the N-type GaN doping layer 4. Red-light colloidal quantum dot structure formed in a region that corresponds to the first sub-pixel region and that is at a second surface of the N-type GaN doping layer For a structure, a material, a light-emitting principle, a light-emitting effect, a size setting, and the like of the red-light colloidal quantum dot structure, refer to the related descriptions of the LED chip shown in FIG. 2. Details are not described herein again.

It should be noted that, in the LED chip shown in FIG. 7, the first sub-pixel structure includes either of the blue-light quantum well structure and the green-light quantum well structure. To be specific, the red-light colloidal quantum dot structure may emit red light by absorbing spectral energy of blue t, or may emit red light by absorbing spectral energy of green light. In actual implementation, conversion efficiency obtained after the red-light colloidal quantum dot structure absorbs the spectral energy of blue light is relatively high. Therefore, when the first sub-pixel structure of the LED chip shown in FIG. 7 includes the blue-light quantum well structure, the LED chip has higher light-emitting efficiency.

In the LED chip shown in FIG. 7, red light may be emitted in a region corresponding to the first sub-pixel structure, by using the disposed red-light colloidal quantum dot structure. In addition, because the second sub-pixel structure in the three sub-pixel structures includes the blue-light quantum well structure, display of blue light can be implemented by using the second sub-pixel structure; and because the third sub-pixel structure in the three sub-pixel structures includes the green-light quantum well structure, display of green light can be implemented by using the third sub-pixel structure.

To better implement display of three types of color light (namely, red light, blue light, and green light) of the LED chip and improve color purity, a light filter may be disposed in a corresponding light-emitting region. In other words, the LED chip shown in FIG. 7 may further include: a red light filter disposed on the red-light colloidal quantum dot structure; a blue light filter disposed in a region that corresponds to the second sub-pixel region and that is at the second surface of the N-type GaN doping layer; and a green light filter disposed in a region that corresponds to the third sub-pixel region and that is at the second surface of the N-type GaN doping layer.

The red light filter disposed on the red-light colloidal quantum dot structure can be used to filter out color light (for example, blue light or green light) other than red light in the first sub-pixel region. The blue light filter disposed in the region corresponding to the second sub-pixel region can be used to filter out color light (for example, green light) other than blue light in the second sub-pixel region. The green light filter disposed in the region corresponding to the third sub-pixel region can be used to filter out color light (for example, blue light) other than green light in the third sub-pixel region.

Figure 8:
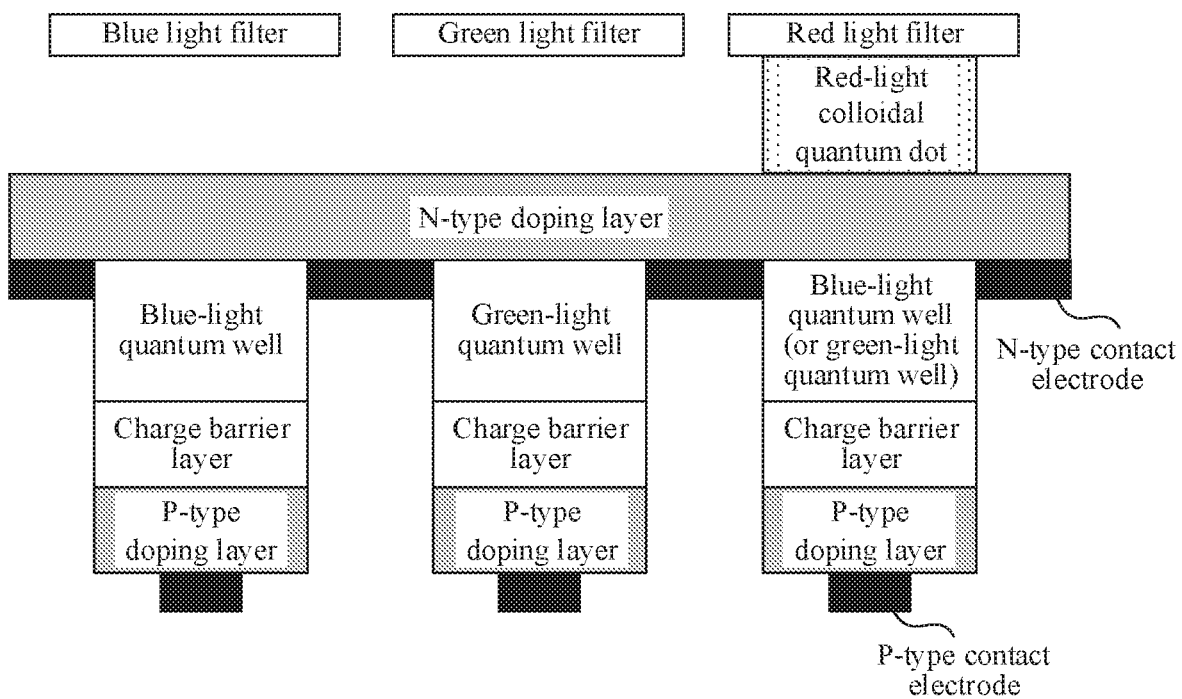
FIG. 8 is a schematic structural diagram of a seventh GaN-based LED chip according to an embodiment of this application.

After the red light filter, the blue light filter, and the green light filter are disposed, a structure of the LED chip may be shown in FIG. 8. In the LED chip shown in FIG. 8, red light can be emitted in a region above the red light filter, green light can be emitted in a region above the green light filter, and blue light can be emitted in a region above the blue light filter.

In the LED chip shown in FIG. 7, the charge barrier layer can reduce charge leakage of the sub-pixel structure. For example, the charge barrier layer may be made of $Al_{0.15}Ga_{0.85}N$, and a thickness of the charge barrier layer may be 15 nm to 35 nm. The N-type GaN doping layer may be a GaN layer doped with silicon, and a thickness of the N-type GaN doping layer may be 2 µm to 3 µm. The P-type GaN doping layer in the first sub-pixel structure, the P-type GaN doping layer in the second sub-pixel structure, and the P-type GaN doping layer in the third sub-pixel structure each may be a GaN layer doped with magnesium, and a thickness of the P-type GaN doping layer may be 150 nm to 300 nm.

In addition, for explanation about the three sub-pixel regions in the LED chip shown in FIG. 7, refer to the related descriptions of the LED chip shown in FIG. 2. Details are not described herein again.

In the LED chip shown in FIG. 7, the blue-light quantum well structure in the second sub-pixel structure may include N blue-light quantum well layers, and N+1 isolation layers that are used to isolate the N blue-light quantum well layers and that are alternately formed with the N blue-light quantum well layers, where N=1. Similarly, the green-light quantum well structure in the third sub-pixel structure may include M green-light quantum well layers, and M+1 isolation layers that are used to isolate the M green-light quantum well layers and that are alternately formed with the M green-light quantum well layers, where M≥1.

In addition, if the first sub-pixel structure includes the blue-light quantum well structure, a structure of the blue-light quantum well structure in the first sub-pixel structure may be the same as that of the blue-light quantum well structure in the second sub-pixel structure. If the first sub-pixel structure includes the green-light quantum well structure, a structure of the green-light quantum well structure in the first sub-pixel structure may be the same as that of the green-light quantum well structure in the third sub-pixel structure.

In other words, specific internal structures of the blue-light quantum well structure and the green-light quantum well structure in the LED chip shown in FIG. 7 are the same as those in the LED chip shown in FIG. 2. For a specific implementation, refer to the related descriptions of the LED chip shown in FIG. 2.

Figure 9:
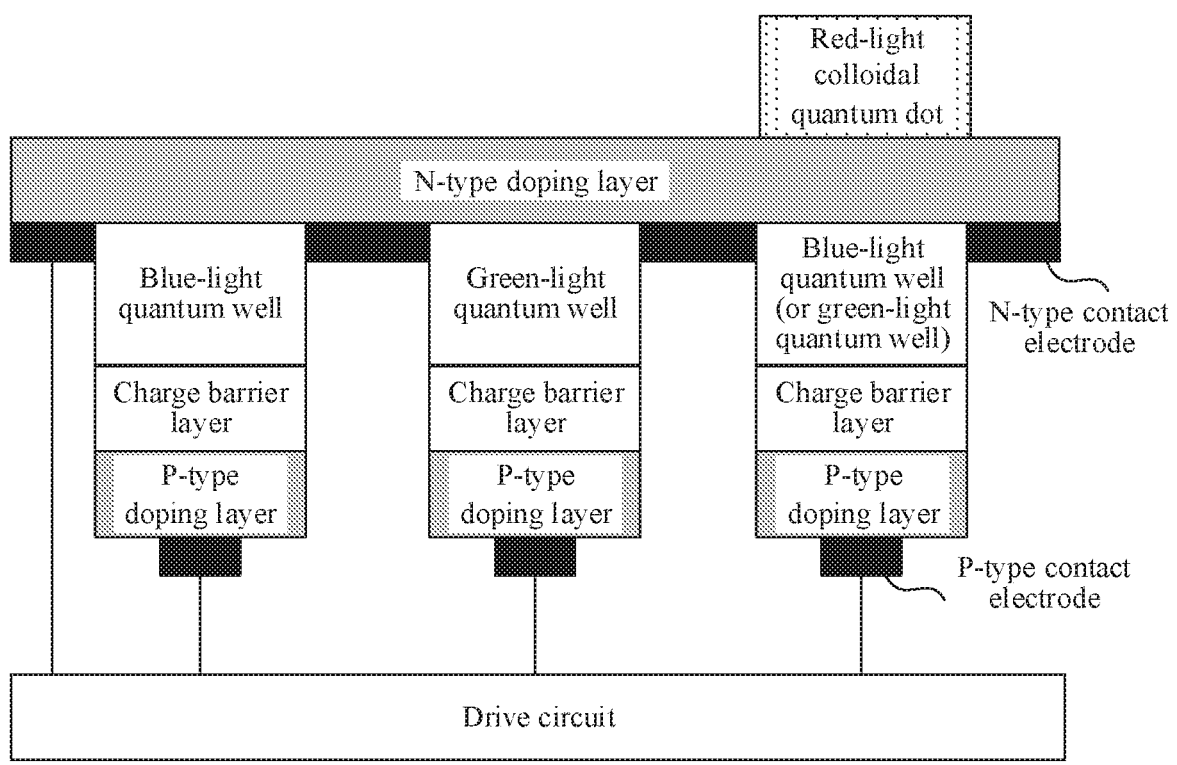
FIG. 9 is a schematic structural diagram of an eighth GaN-based LED chip according to an embodiment of this application.

In addition, as shown in FIG. 9, the LED chip shown in FIG. 7 may further include a drive circuit connected to the three P-type contact electrodes and the N-type contact electrode. The drive circuit may control luminous intensity of each sub-pixel structure by using a PWM technology, so that blue light, green light, and red light emitted by all the sub-pixel structures in the LED chip have same color brightness.

Similarly, when the LED chip shown in FIG. 7 is prepared, if cleavage is not performed on the substrate and the buffer layer after the material growth is completed, the LED chip further includes: a buffer layer and a substrate that are formed at the second surface of the N-type GaN doping layer, where the buffer layer is adjacent to the N-type GaN doping layer, and the substrate is adjacent to the buffer layer and the red-light colloidal quantum dot structure.

It should be noted that the LED chip shown in FIG. 7 includes only three sub-pixel structures. In other words, the LED chip includes only one pixel. In actual implementation, the LED chip may include a plurality of sub-pixel structures, and every three of the plurality of sub-pixel structures are a group used as one pixel of the LED chip. A structure of each pixel may be shown in FIG. 7. Each pixel is a basic unit for full-color display of the LED chip.

In conclusion, in the LED chip shown in FIG. 7, because the second sub-pixel structure in the three sub-pixel structures includes the blue-light quantum well structure, the LED chip can emit blue light by using the second sub-pixel structure: and because the third sub-pixel structure in the three sub-pixel structures includes the green-light quantum well structure, the LED chip can emit green light by using the third sub-pixel structure. In addition, a red-light colloidal quantum dot structure may be used for coating in a region corresponding to the first sub-pixel structure that includes the blue-light quantum well structure or the green-light quantum well structure. In this way, blue light or green light is absorbed and then converted into red light by using the red-light colloidal quantum dot structure, and the LED chip emits red light. Therefore, full-color display can be implemented by using the LED chip provided in the foregoing solution.

In addition, because the red-light colloidal quantum dot structure has characteristics such as narrow line width and high photoluminescence fluorescence efficiency, the red-light colloidal quantum dot structure is used to absorb blue light and green light, to implement a solution in which the LED chip for full-color display emits red light. When the solution is compared with a solution in the prior art in which the LED chip emits red light by using a red-light quantum well structure, the light-emitting efficiency of the LED chip can be improved, thereby reducing power consumption of the LED chip.

It is not difficult to learn from the description about the LED chip shown in FIG. 7 that a main difference between the LED chip shown in FIG. 7 and the LED chip shown in FIG. 2 is that internal structures of the three sub-pixel structures in the LED chip shown in FIG. 7 are different from those in the LED chip shown in FIG. 2.

In the LED chip shown in FIG. 2, the internal structures of all the sub-pixel structures are the same, and each sub-pixel structure includes a blue-light quantum well structure and a green-light quantum well structure. The red light can be emitted after the first sub-pixel structure on which the red-light colloidal quantum dots are correspondingly disposed absorbs blue light and green light. For the other two sub-pixel structures, which sub-pixel structure emits blue light and which sub-pixel structure emits green light depend on a color of a disposed light filter. In other words, a sub-pixel structure on which the blue light filter is correspondingly disposed is used to emit blue light, and a sub-pixel structure on which the green light filter is correspondingly disposed is used to emit green light.

In the LED chip shown in FIG. 7, the internal structures of all the sub-pixel structures are different. The First sub-pixel structure includes one of the blue-light quantum well structure or the green-light quantum well structure, the second sub-pixel structure includes the blue-light quantum well structure, and the third sub-pixel structure includes the green-light quantum well structure. The red light can be emitted after the first sub-pixel structure on which the red-light colloidal quantum dots are correspondingly disposed absorbs blue light or green light. For the other two sub-pixel structures, the second sub-pixel structure including the blue-light quantum well structure is used to emit blue light, and the third sub-pixel structure including the green-light quantum well structure is used to emit green light.

In specific implementation, the LED chip shown in FIG. 2 or the LED chip shown in FIG. 7 may be selectively used.

When the LED chip shown in FIG. 2 is prepared, because the structures of all the sub-pixel structures are the same, in a material growth process of the LED chip, it is unnecessary to consider which sub-pixel structure is used to emit which color of light. In other words, it is unnecessary to separately perform material growth for different sub-pixel structures, an operation procedure for the material growth process can be simplified. Therefore, if it is expected to simplify a preparation procedure of the LED chip, the LED chip shown in FIG. 2 may be used.

When the LED chip shown in FIG. 7 is prepared, some parts of materials need to be grown first during material growth. After a mask is used to protect the grown materials, other parts of materials are grown. Although a procedure of the material growth process is relatively complex, a structure of the LED chip (that is, the LED chip shown in FIG. 7) prepared in this manner is simpler than a structure of the LED chip shown in FIG. 2. This manner is applicable to a scenario in which there is a relatively high requirement for simplifying a structure of an LED chip.

Based on the foregoing descriptions, the LED chip shown in FIG. 2 and the LED chip shown in FIG. 7 are two typical LED chips provided in the embodiments of this application. Based on two embodiments, the following describes preparation methods of the two typical LED chips provided in the embodiments of this application.

Embodiment 1

Figure 10:
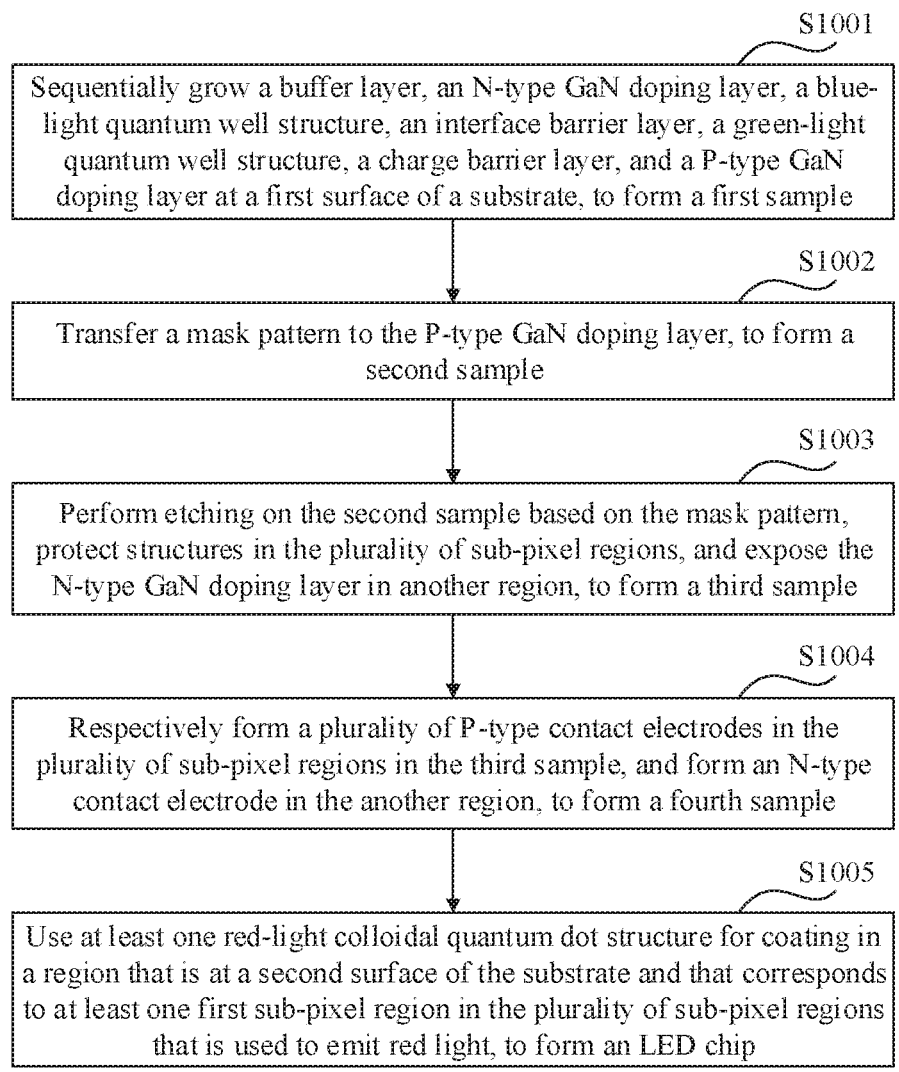
FIG. 10 is a flowchart of a preparation method for an LED chip according to an embodiment of this application.

This embodiment of this application provides a preparation method for an LED chip. The method is used to prepare the LED chip shown in FIG. 2. Referring to FIG. 10, the method includes the following steps:

S1001: Sequentially grow a buffer layer, an N-type GaN doping layer, a blue-light quantum well structure, an interface barrier layer, a green-light quantum well structure, a charge barrier layer, and a P-type GaN doping layer at a first surface of a substrate, to form a first sample.

In step S1001, material growth may be performed in a metalorganic chemical vapor deposition (MOCVD) manner.

The substrate may be any one of a sapphire substrate, a Si substrate, a SiC substrate, or a GaN substrate. The buffer layer may be a GaN buffer layer, and a thickness of the buffer layer may be selected from 2 µm to 3 µm. The N-type GaN doping layer may be a GaN layer doped with silicon, and a thickness of the N-type GaN doping layer may be 2 µm to 3 µm. The P-type GaN doping layer may be a GaN layer doped with magnesium, and a thickness of the P-type GaN doping layer may be 150 nm to 300 nm. The charge barrier layer can reduce charge leakage of a sub-pixel structure. For example, the charge barrier layer may be made of $Al_{0.45}Ga_{0.85}N$, and a thickness of the charge barrier layer may be 15 nm to 35 nm.

S1002: Transfer a mask pattern to the P-type GaN doping layer, to form a second sample.

The mask pattern includes a plurality of sub-pixel regions and a remaining region other than the plurality of sub-pixel regions.

In other words, the first sample grown in step S1001 may be divided to a plurality of sub-pixel regions and a remaining region by using the mask pattern.

S1003: Perform etching on the second sample based on the mask pattern, protect structures in the plurality of sub-pixel regions, and expose the N-type GaN doping layer in the remaining region, to form a third sample.

Specifically, in step S1003, the performing etching on the second sample based on the mask pattern, protecting structures in the plurality of sub-pixel regions, and exposing the N-type GaN doping layer in the remaining region other than the plurality of sub-pixel regions in the mask pattern may be implemented in the following manner: passivating and protecting a side surface of the LED chip and the plurality of sub-pixel regions; and performing etching on the remaining region by using inductively coupled plasma (ICP) or through reactive ion etching (RIE), so that the N-type GaN doping layer in the remaining region is exposed.

S1004: Respectively form a plurality of P-type contact electrodes in the plurality of sub-pixel regions in the third sample, and form an N-type contact electrode in the remaining region, to form a fourth sample.

Specifically, in step S1004, the respectively forming a plurality of P-type contact electrodes in the plurality of sub-pixel regions, and forming an N-type contact electrode in the remaining region may be implemented in the following manner: evaporating and depositing a gold-nickel alloy by using an electron beam, and respectively forming the plurality of P-type contact electrodes in the plurality of sub-pixel regions after annealing at 200° C. to 500° C.; and sputtering indium tin oxide (ITO) or graphite in the remaining region, to form the N-type contact electrode. In this embodiment of this application, the plurality of sub-pixel structures share one N-type contact electrode. The N-type contact electrode may also be referred to as a common cathode.

Figure 11:
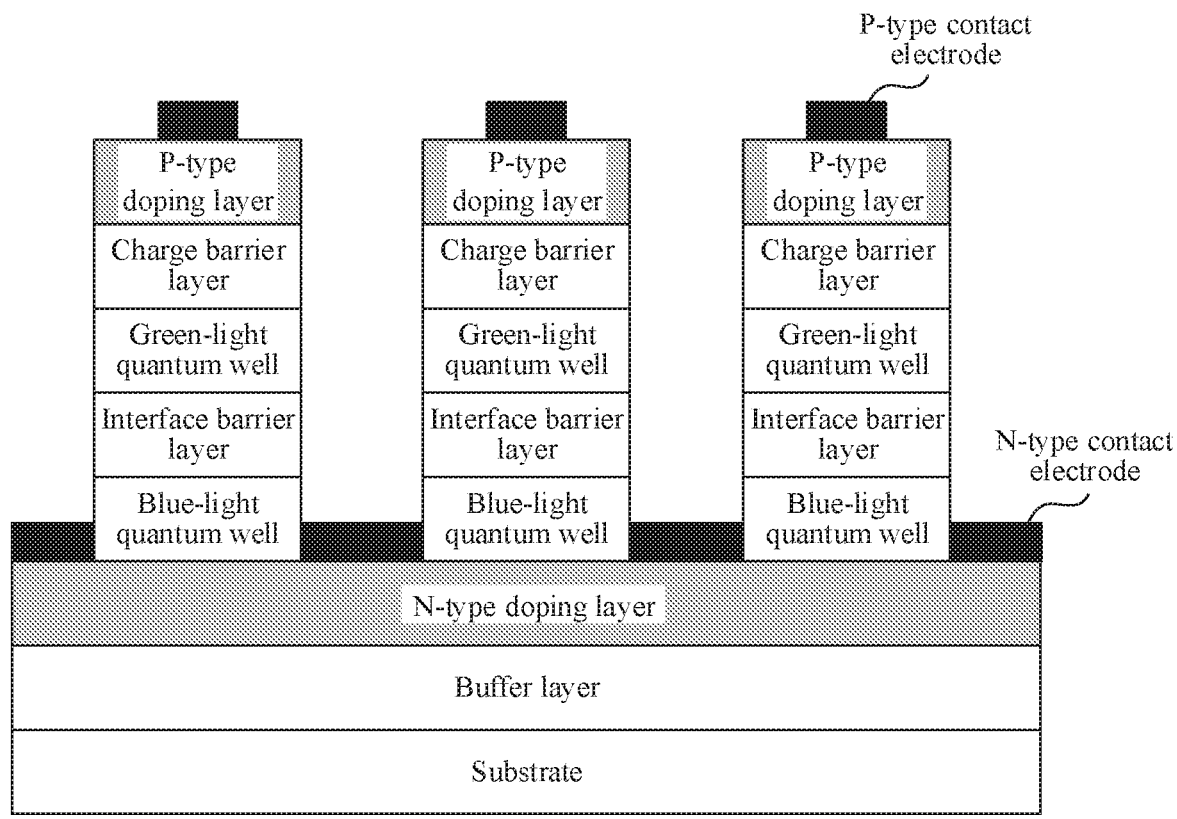
FIG. 11 is a schematic structural diagram of a fourth sample according to an embodiment of this application.

After step S1004 is performed, a structure of the formed fourth sample may be shown in FIG. 11. It should be noted that FIG. 11 shows an LED chip including only three sub-pixel structures. In actual implementation, the fourth sample obtained after step S1004 is performed may include a plurality of sub-pixel structures, and every three sub-pixel structures in the plurality of sub-pixel structures may be used as one pixel to implement full-color display.

Figure 12:
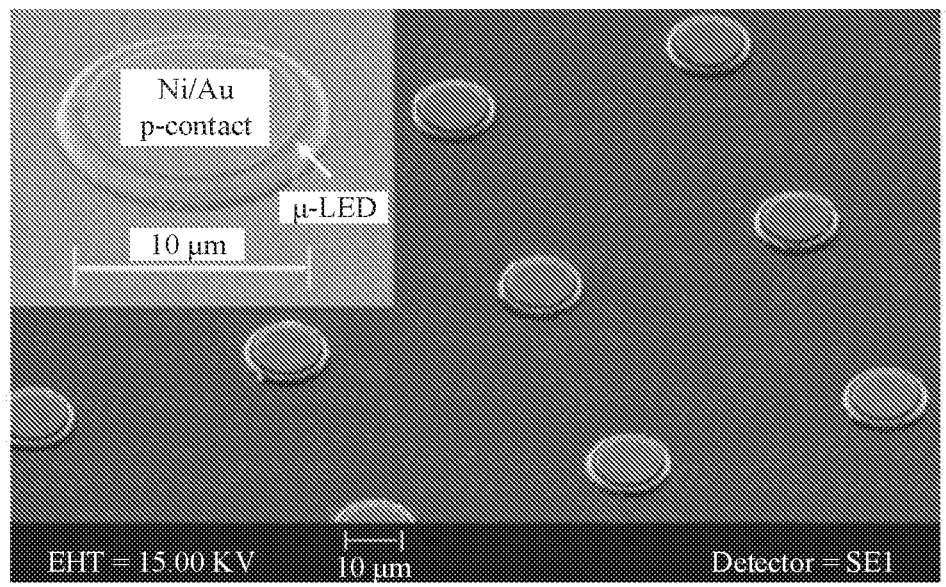
FIG. 12 is a SEM image of a fourth sample according to an embodiment of this application.

In addition a scanning electron microscopy (SEM) image of the fourth sample may be shown in FIG. 12. In FIG. 12, each protruding cylindrical structure represents one sub-pixel structure, and each sub-pixel structure includes a p-contact (that is, a P-type contact electrode). In FIG. 12, a planar region other than the protruding parts may be considered as the remaining region other than the sub-pixel regions, and an N-type contact electrode is formed in the region.

S1005: Use at least one red-light colloidal quantum dot structure for coating in a region that is at a second surface of the substrate and that corresponds to at least one first sub-pixel region in the plurality of sub-pixel regions that is used to emit red light, to form an LED chip.

Figure 13:
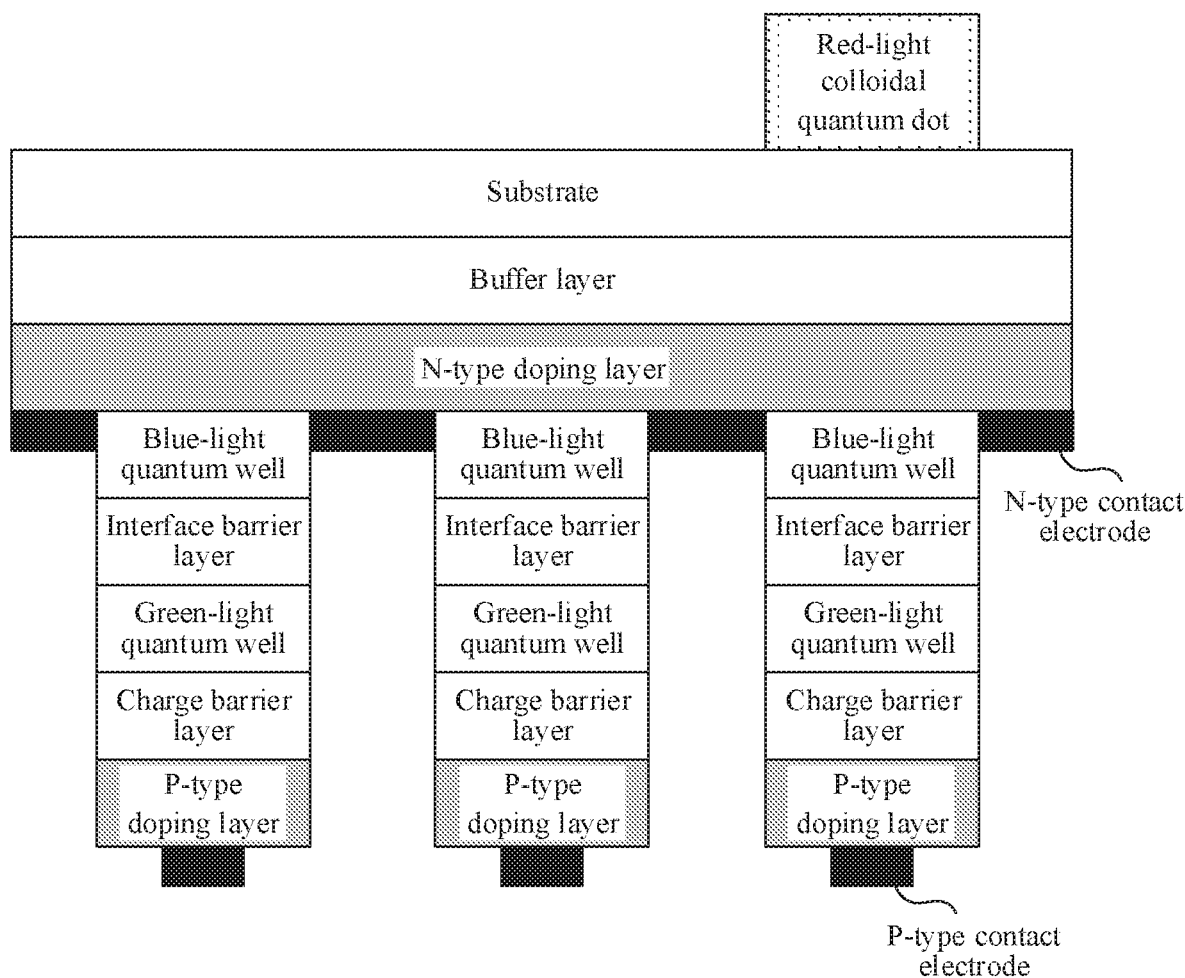
FIG. 13 is a schematic structural diagram of a ninth GaN-based LED chip according to an embodiment of this application.

The LED chip prepared by using the method shown in FIG. 10 may be shown in FIG. 13. It should be noted that the LED chip shown in FIG. 13 includes only three sub-pixel structures. In actual implementation, the LED chip prepared by using the method shown in FIG. 10 may include a plurality of sub-pixel structures, every three sub-pixel structures may form one pixel, and each pixel is used as a basic unit for full-color display of the LED chip.

Optionally, the method shown in FIG. 10 may further include: respectively disposing at least one red light filter on the at least one red-light colloidal quantum dot structure; respectively disposing at least one blue light filter in a region that is at the second surface of the substrate and that corresponds to at least one second sub-pixel region in the plurality of sub-pixel regions that is used to emit blue light; and respectively disposing at least one green light filter in a region that is at the second surface of the substrate and that corresponds to at least one third sub-pixel region in the plurality of sub-pixel regions that is used to emit green light.

Different colors of light filters are disposed at the second surface of the substrate, so that other color light other than the color of light can be filtered out, thereby improving color purity of the LED chip used for full-color display.

Optionally, the method shown in FIG. 10 may further include: connecting a drive circuit to the plurality of P-type contact electrodes and the N-type contact electrode through alignment by using a metal solder ball.

A PWM current of the drive circuit may be controlled to control luminous intensity of each sub-pixel structure, so that blue light, green light, and red light emitted by all the sub-pixel structures in the LED chip have same color brightness.

Optionally, in the method shown in FIG. 10, before the at least one red-light colloidal quantum dot structure is respectively used for coating, cleavage may be further performed between the LED chip and each of the substrate and the buffer layer in a laser radiation manner. In this case, in step S1005, an operation of using the at least one red-light colloidal quantum dot structure for coating may be implemented in the following manner: respectively using the at least one red-light colloidal quantum dot structure for coating in the region that is at the surface of the N-type GaN doping layer adjacent to the buffer layer and that corresponds to the at least one first sub-pixel region.

After the material growth is completed, cleavage may be performed on the substrate and the buffer layer because functions of the substrate and the buffer layer have been completed, so that a structure of the LED chip is simplified.

Figure 14:
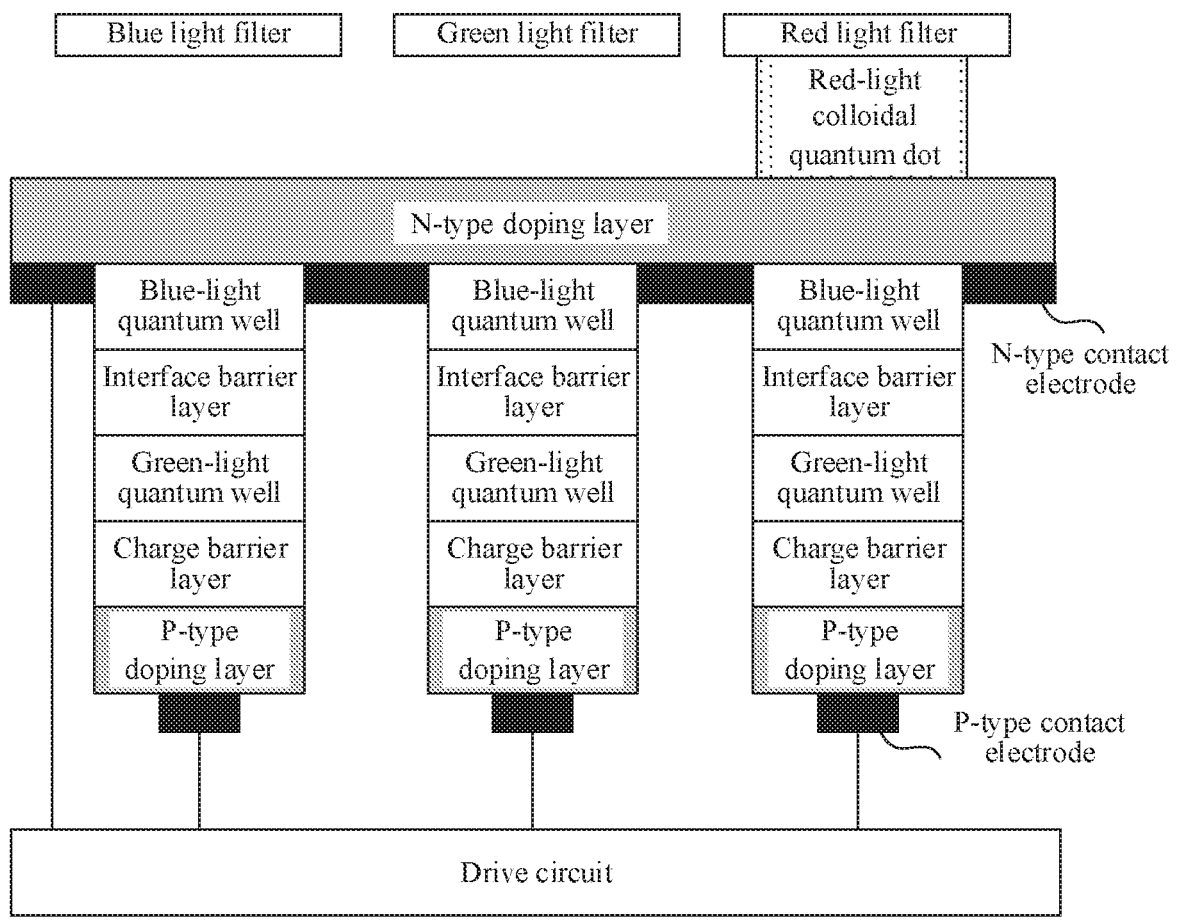
FIG. 14 is a schematic structural diagram of a tenth GaN-based LED chip according to an embodiment of this application.

After the three colors of light filters are disposed, the drive circuit is connected, and cleavage is performed on the substrate and the buffer layer, a possible structure of the LED chip prepared in the manner shown in FIG. 10 may be shown in FIG. 14. The LED chip shown in FIG. 14 may be considered as a specific example of the LED chip shown in FIG. 2.

It should be noted that the method shown in FIG. 10 may be used to prepare the LED chip shown in FIG. 2. For an implementation that is not described in detail in the method shown in FIG. 10, refer to the related descriptions of the LED chip shown in FIG. 2.

Embodiment 2

Figure 15:
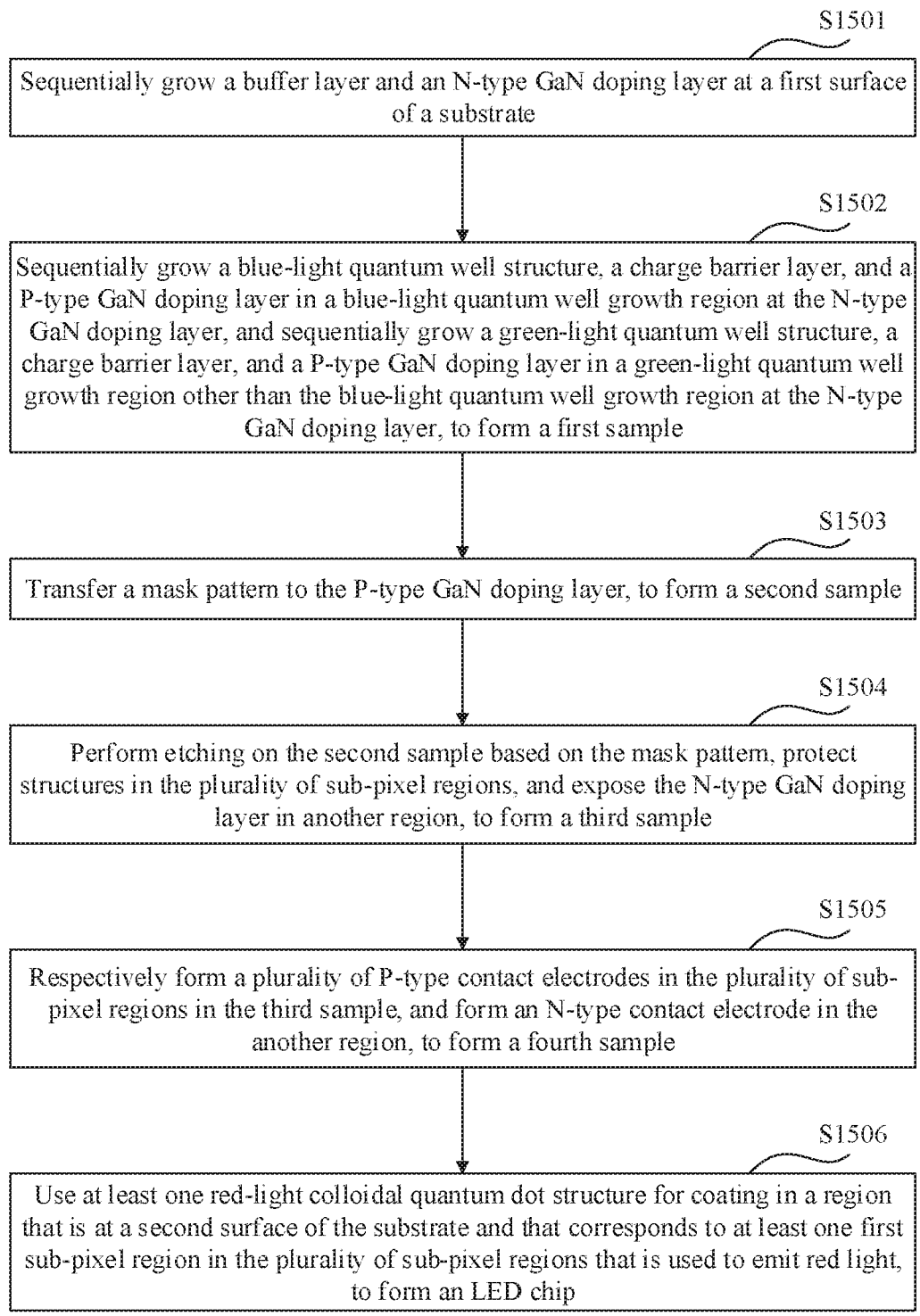
FIG. 15 is a flowchart of another preparation method for an LED chip according to an embodiment of this application.

This embodiment of this application provides a preparation method for an LED chip. The method may be used to prepare the LED chip shown in FIG. 7. Referring to FIG. 15, the method includes the following steps:

S1501: Sequentially grow a buffer layer and an N-type GaN doping layer at a first surface of a substrate.

The substrate may be any one of a sapphire substrate, a Si substrate, a SiC substrate, or a GaN substrate. The buffer layer may be a GaN buffer layer, and a thickness of the buffer layer may be selected from 2 µm to 3 µm. The N-type GaN doping layer may be a GaN layer doped with silicon, and a thickness of the N-type GaN doping layer may be 2 µm to 3 µm.

S1502: Sequentially grow a blue-light quantum well structure, a charge barrier layer, and a P-type GaN doping layer in a blue-light quantum well growth region at the N-type GaN doping layer, and sequentially grow a green-light quantum well structure, a charge barrier layer, and a P-type GaN doping layer in a green-light quantum well growth region other than the blue-light quantum well growth region at the N-type GaN doping layer, to form a first sample.

In step S1502, in material growth, the N-type GaN doping layer is divided to the blue-light quantum well growth region and the green-light quantum well growth region, and different structures are grown in different quantum well growth regions.

Specifically, the material growth process in step S1502 may be implemented in the following manner: preparing a first mask at the N-type GaN doping layer, where the first mask is used to protect the green-light quantum well growth region; sequentially growing the blue-light quantum well structure, the charge barrier layer, and the P-type GaN doping layer in the blue-light quantum well growth region; removing the first mask; preparing a second mask in the blue-light quantum well growth region, where the second mask is used to protect the blue-light quantum well growth region; and sequentially growing the green-light quantum well structure, the charge barrier layer, and the P-type GaN doping layer in the green-light quantum well growth region.

S1503: Transfer a mask pattern to the P-type GaN doping layer, to form a second sample.

The mask pattern includes a plurality of sub-pixel regions and a remaining region other than the plurality of sub-pixel regions. The plurality of sub-pixel regions include at least one first sub-pixel region used to emit red light, at least one second sub-pixel region used to emit blue light, and at least one third sub-pixel region used to emit green light. The at least one first sub-pixel region is aligned with the blue-light quantum well growth region or the green-light quantum well growth region. The at least one second sub-pixel region is aligned with the blue-light quantum well growth region. At least one third sub-pixel region is aligned with the green-light quantum well growth region.

In other words, the first sample grown in step S1502 may be divided to a plurality of sub-pixel regions and a remaining region by using the mask pattern.

S1504: Perform etching on the second sample based on the mask pattern, protect structures in the plurality of sub-pixel regions, and expose the N-type GaN doping layer in the remaining region, to form a third sample.

When etching is performed on the second sample based on the mask pattern, because the at least one second sub-pixel region in the mask pattern is aligned with the blue-light quantum well growth region, corresponding structures in the at least one second sub-pixel region obtained after the etching are structures grown in the blue-light quantum well growth region, that is, the blue-light quantum well structure, the charge barrier layer, and the P-type GaN doping layer. The LED chip can emit blue light by using the structure.

Similarly, because the at least one third sub-pixel region in the mask pattern is aligned with the green-light quantum well growth region, corresponding structures in the at least one third sub-pixel region obtained after the etching are structures grown in the green-light quantum well growth region, that is, the green-light quantum well structure, the charge barrier layer, and the P-type GaN doping layer. The LED chip can emit green light by using the structure.

In addition, the at least one first sub-pixel region is aligned with the blue-light quantum well growth region or the green-light quantum well growth region. Therefore, after the etching, the LED chip can emit red light by using red-light colloidal quantum dots for coating in a corresponding structure in the first sub-pixel region.

Specifically, in step S1504, the performing etching on the second sample based on the mask pattern, protecting structures in the plurality of sub-pixel regions, and exposing the N-type GaN doping layer in the remaining region other than the plurality of sub-pixel regions in the mask pattern may be implemented in the following manner: passivating and protecting a side surface of the LED chip and the plurality of sub-pixel regions; and performing etching on the remaining region in an ICP manner or an RIE manner, so that the N-type GaN doping layer in the remaining region is exposed.

S1505: Respectively form a plurality of P-type contact electrodes in the plurality of sub-pixel regions in the third sample, and form an N-type contact electrode in the remaining region, to form a fourth sample.

Specifically, in step S1505, the respectively forming a plurality of P-type contact electrodes in the plurality of sub-pixel regions, and forming an N-type contact electrode in the remaining region may be implemented in the following manner: evaporating and depositing a gold-nickel alloy by using an electron beam, and respectively forming the plurality of P-type contact electrodes in the plurality of sub-pixel regions after annealing at 200° C. to 500° C.; and sputtering indium tin oxide (ITO) or graphite in the remaining region, to form the N-type contact electrode. In this embodiment of this application, the plurality of sub-pixel structures share one N-type contact electrode. The N-type contact electrode may also be referred to as a common cathode.

Figure 16:
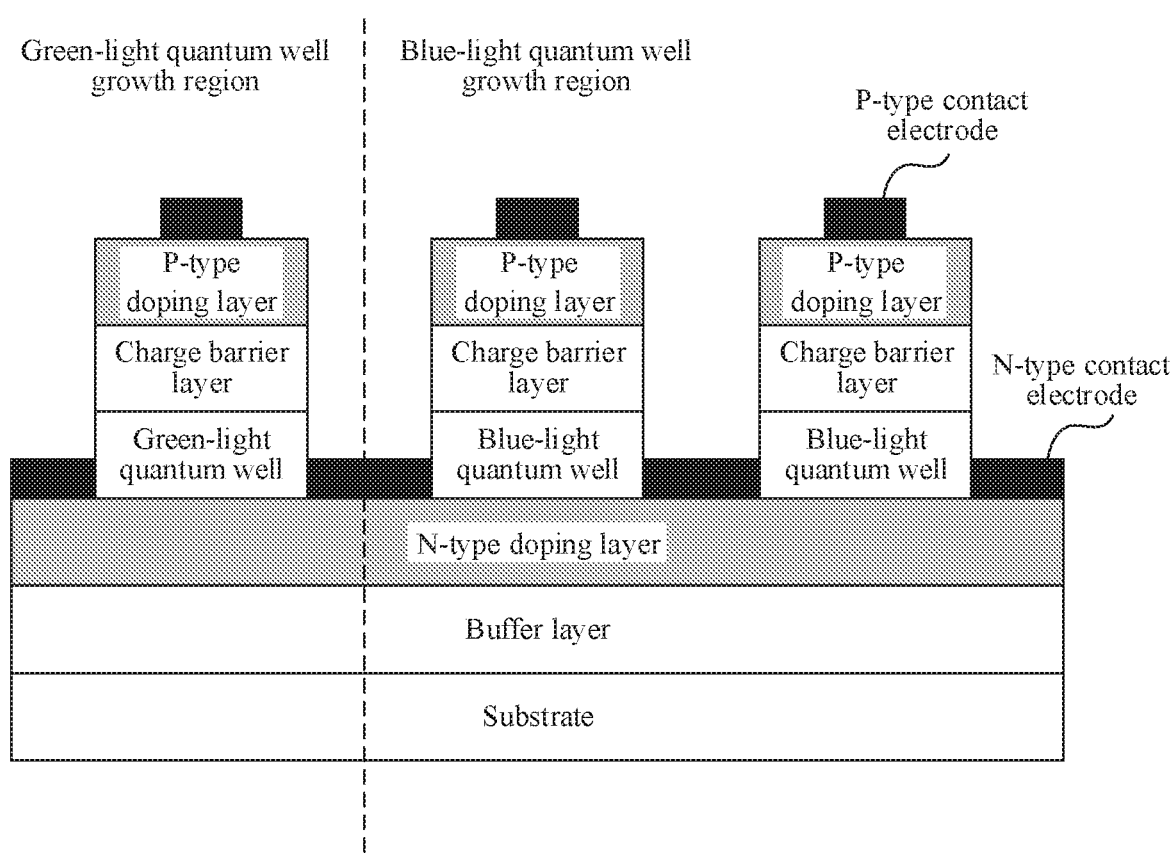
FIG. 16 is a schematic structural diagram of another fourth sample according to an embodiment of this application.

After step S1505 is performed, a structure of the formed fourth sample may be shown in FIG. 16. It should be noted that FIG. 16 shows an LED chip including only three sub-pixel structures. In actual implementation, the fourth sample obtained after step S1505 is performed may include a plurality of sub-pixel structures, and every three sub-pixel structures in the plurality of sub-pixel structures may be used as one pixel to implement full-color display.

In addition, in the fourth sample shown in FIG. 16, the at least one first sub-pixel region is aligned with the blue-light quantum well growth region.

S1506: Respectively use at least one red-light colloidal quantum dot structure for coating in a region that is at a second surface of the substrate and that corresponds to the at least one first sub-pixel region; to form an LED chip.

Figure 17:
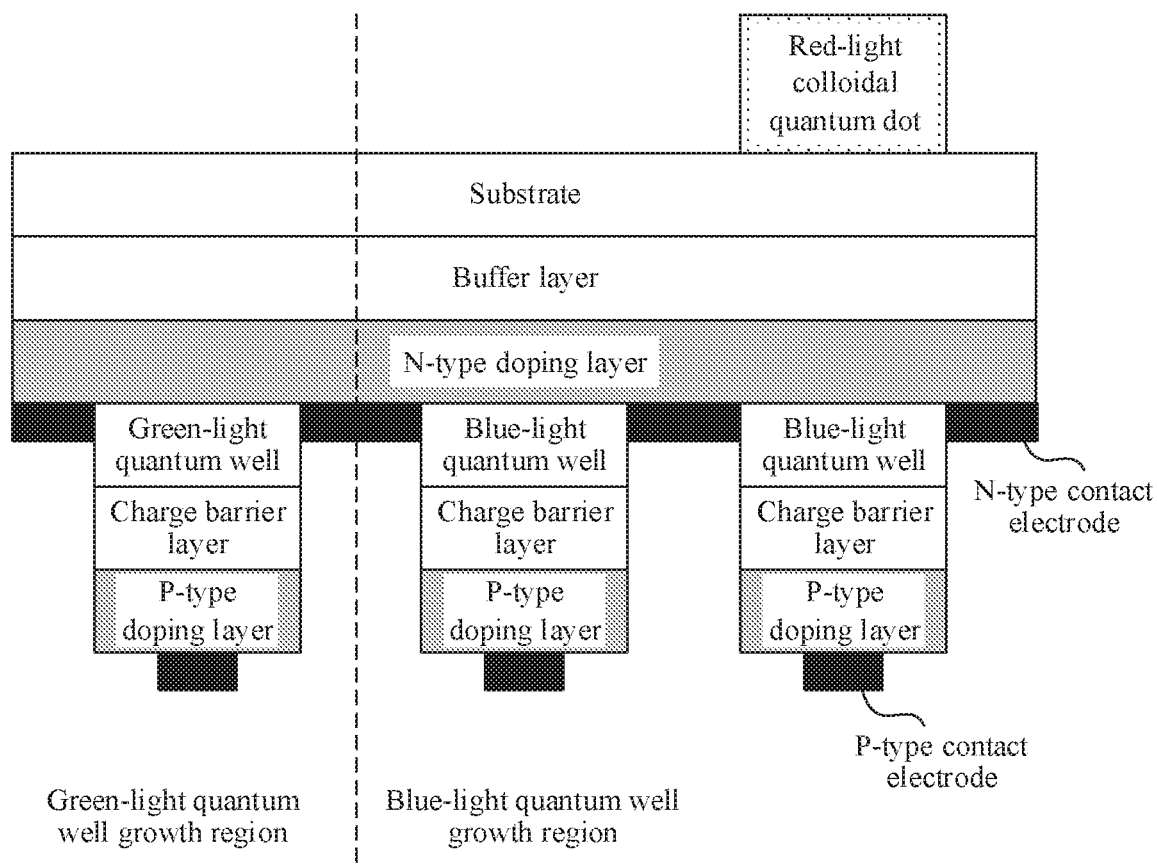
FIG. 17 is a schematic structural diagram of an eleventh GaN-based LED chip according to an embodiment of this application.

Step S1506 is performed on the fourth sample shown in FIG. 16, to obtain the LED chip shown in FIG. 17. It should be noted that the LED chip shown in FIG. 17 includes only three sub-pixel structures. In actual implementation, the LED chip prepared by using the method shown in FIG. 15 may include a plurality of sub-pixel structures, every three sub-pixel structures may form one pixel, and each pixel is used as a basic unit for full-color display of the LED chip.

Optionally, the method shown in FIG. 15 may further include: respectively disposing at least one red light filter on the at least one red-light colloidal quantum dot structure; respectively disposing at least one blue light filter in a region that is at the second surface of the substrate and that corresponds to the at least one second sub-pixel region; and respectively disposing at least one green light filter in a region that is at the second surface of the substrate and that corresponds to the at least one third sub-pixel region.

Different colors of light filters are disposed at the second surface of the substrate, so that other color light other than the color of light can be filtered out, thereby improving color purity of the LED chip used for full-color display.

Optionally, the method shown in FIG. 15 may further include: connecting a drive circuit to the plurality of P-type contact electrodes and the N-type contact electrode through alignment by using a metal solder ball.

A PWM current of the drive circuit may be controlled to control luminous intensity of each sub-pixel structure, so that blue light, green light, and red light emitted by all the sub-pixel structures in the LED chip have same color brightness.

Optionally, in the method shown in FIG. 15, before the at least one red-light colloidal quantum dot structure is respectively used for coating, cleavage may be further performed between the LED chip and each of the substrate and the buffer layer in a laser radiation manner. In this case, in step S1506, an operation of using the at least one red-light colloidal quantum dot structure for coating may be implemented in the following manner: respectively using the at least one red-light colloidal quantum dot structure for coating in the region that is at the surface of the N-type GaN doping layer adjacent to the buffer layer and that corresponds to the at least one first sub-pixel region.

After the material growth is completed, cleavage may be performed on the substrate and the buffer layer because functions of the substrate and the buffer layer have been completed, so that a structure of the LED chip is simplified.

Figure 18:
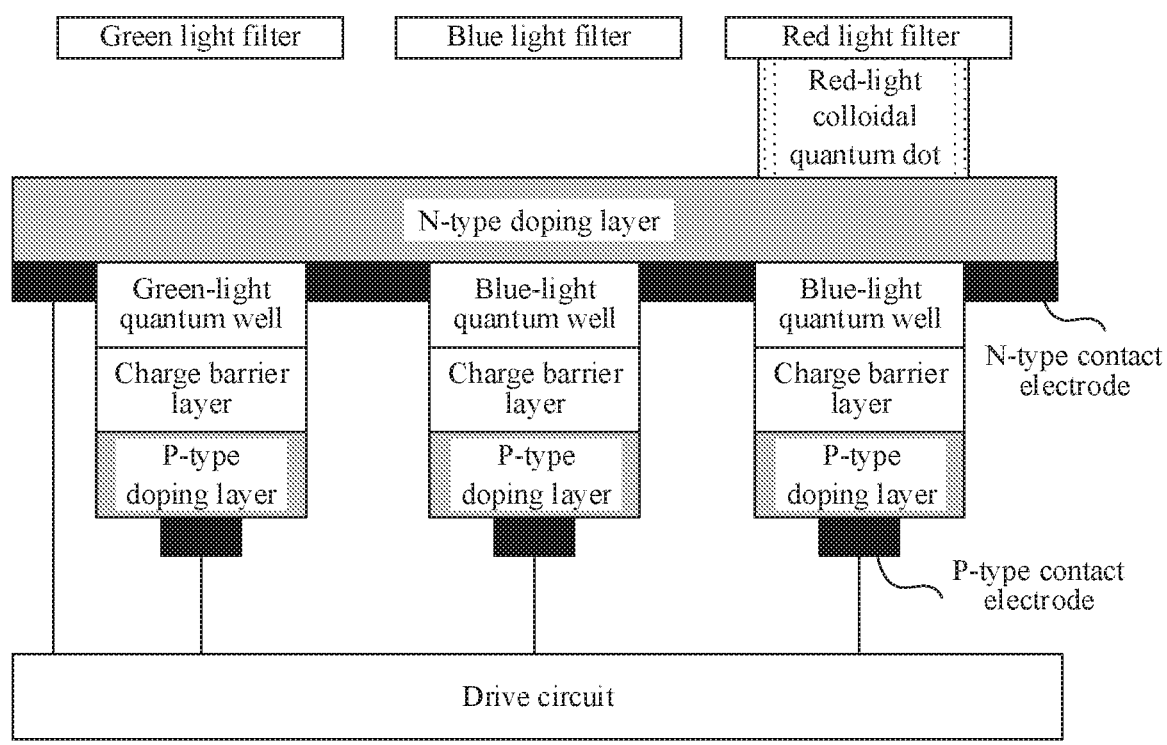
FIG. 18 is a schematic structural diagram of a twelfth GaN-based LED chip according to an embodiment of this application.

After the three colors of light filters are disposed, the drive circuit is connected, and cleavage is performed on the substrate and the buffer layer, a possible structure of the LED chip prepared in the manner shown in FIG. 1.5 may be shown in FIG. 18. The LED chip shown in FIG. 18 may be considered as a specific example of the LED chip shown in FIG. 7.

It is not difficult to learn from the foregoing description of Embodiment 2 that Embodiment 2 and Embodiment 1 are different only in a material growth process (that is, S1001 in FIG. 10, and S1501 and S1502 in FIG. 15), and other preparation steps are similar or the same. However, due to different material growth steps, structures of LED chips finally obtained after the preparation are different.

It should be noted that the method shown in FIG. 15 may be used to prepare the LED chip shown in FIG. 7. For an implementation that is not described in detail in the method shown in FIG. 15, refer to the related descriptions of the LED chip shown in FIG. 7.

In conclusion, the embodiments of this application provide the LED chip and the preparation method therefor. In the solution provided in the embodiments of this application, full-color display can be implemented by using the LED chip.

It is clear that, a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A light-emitting diode (LED) chip, comprising:
an N-type gallium nitride (GaN) doping layer;
three sub-pixel structures respectively formed in three sub-pixel regions at a first surface of the N-type GaN doping layer, wherein each of the three sub-pixel structures comprises a blue-light quantum well structure, an interface barrier layer, a green-light quantum well structure, a charge barrier layer, and a P-type GaN doping layer that grow in sequence;
three P-type contact electrodes respectively formed on the three sub-pixel structures, and an N-type contact electrode formed in a remaining region other than the three sub-pixel regions at the first surface of the N-type GaN doping layer; and
a red-light colloidal quantum dot structure formed in a region that corresponds to a first sub-pixel region in the three sub-pixel regions and that is at a second surface of the N-type GaN doping layer.

2. The chip according to claim 1, wherein the blue-light quantum well structure comprises N blue-light quantum well layers, and N+1 isolation layers that are used to isolate the N blue-light quantum well layers and that are alternately formed with the N blue-light quantum well layers, wherein $N \geq 1$.

3. The chip according to claim 1, wherein the green-light quantum well structure comprises M green-light quantum well layers, and M+1 isolation layers that are used to isolate the M green-light quantum well layers and that are alternately formed with the M green-light quantum well layers, wherein $M \geq 1$.

4. The chip according to claim 1, further comprising:
a red light filter disposed on the red-light colloidal quantum dot structure;
a blue light filter disposed in a region that corresponds to a second sub-pixel region in the three sub-pixel regions and that is at the second surface of the N-type GaN doping layer; and
a green light filter disposed in a region that corresponds to a third sub-pixel region in the three sub-pixel regions and that is at the second surface of the N-type GaN doping layer.

5. The chip according to claim 1, further comprising:
a drive circuit connected to the three P-type contact electrodes and the N-type contact electrode.

6. The chip according to claim 1, further comprising:
a buffer layer and a substrate that are formed at the second surface of the N-type GaN doping layer, wherein the buffer layer is adjacent to the N-type GaN doping layer, and the substrate is adjacent to the buffer layer and the red-light colloidal quantum dot structure.

7. The chip according to claim 1, wherein the three sub-pixel regions are all circular regions, or the three sub-pixel regions are all square regions.

8. The chip according to claim 1, wherein the N-type GaN doping layer is a GaN layer doped with silicon, and the P-type GaN doping layer is a GaN layer doped with magnesium.

9. The chip according to claim 3, wherein the blue-light quantum well layer is a GaN layer doped with indium, the green-light quantum well layer is a GaN layer doped with indium, and a proportion of indium doped in the green-light quantum well layer is different from a proportion of indium doped in the blue-light quantum well layer.

10. A preparation method for a LED chip, comprising:
sequentially growing a buffer layer, an N-type GaN doping layer, a blue-light quantum well structure, an interface barrier layer, a green-light quantum well structure, a charge barrier layer, and a P-type GaN doping layer at a first surface of a substrate, to form a first sample;
transferring a mask pattern to the P-type GaN doping layer, to form a second sample, wherein the mask pattern comprises a plurality of sub-pixel regions and a remaining region other than the plurality of sub-pixel regions;
performing etching on the second sample based on the mask pattern, protecting structures in the plurality of sub-pixel regions, and exposing the N-type GaN doping layer in the remaining region, to form a third sample;

respectively forming a plurality of P-type contact electrodes in the plurality of sub-pixel regions in the third sample, and forming an N-type contact electrode in the remaining region, to form a fourth sample; and respectively using at least one red-light colloidal quantum dot structure for coating in a region that is at a second surface of the substrate and that corresponds to at least one first sub-pixel region in the plurality of sub-pixel regions that is used to emit red light, to form an LED chip.

11. The method according to claim 10, further comprising:

respectively disposing at least one red light filter on the at least one red-light colloidal quantum dot structure;

respectively disposing at least one blue light filter in a region that is at the second surface of the substrate and that corresponds to at least one second sub-pixel region in the plurality of sub-pixel regions that is used to emit blue light; and respectively disposing at least one green light filter in a region that is at the second surface of the substrate and that corresponds to at least one third sub-pixel region in the plurality of sub-pixel regions that is used to emit green light.

12. The method according to claim 10, further comprising:

connecting a drive circuit to the plurality of P-type contact electrodes and the N-type contact electrode through alignment by using a metal solder ball.

13. The method according to claim 10, before the respectively using at least one red-light colloidal quantum dot structure for coating, further comprising:

performing cleavage between the LED chip and each of the substrate and the buffer layer in a laser radiation manner; wherein the respectively using at least one red-light colloidal quantum dot structure for coating in a region that is at a second surface of the substrate and that corresponds to at least one first sub-pixel region in the plurality of sub-pixel regions that is used to emit red light comprises:

respectively using the at least one red-light colloidal quantum dot structure for coating in the region that is at the surface of the N-type GaN doping layer adjacent to the buffer layer and that corresponds to the at least one first sub-pixel region.

14. The method according to claim 10, wherein the performing etching on the second sample based on the mask pattern, protecting structures in the plurality of sub-pixel regions, and exposing the N-type GaN doping layer in the remaining region comprises:

passivating and protecting a side surface of the LED chip and the plurality of sub-pixel regions; and performing etching on the remaining region by using inductively coupled plasma ICP or through reactive ion etching RIE, so that the N-type GaN doping layer in the remaining region is exposed.

15. The method according to claim 10; wherein the respectively forming a plurality of P-type contact electrodes in the plurality of sub-pixel regions, and forming an N-type contact electrode in the remaining region comprises:

evaporating and depositing a gold-nickel alloy by using an electron beam, and respectively forming the plurality of P-type contact electrodes in the plurality of sub-pixel regions after annealing at 200° C. to 500° C.; and sputtering indium tin oxide ITO or graphite in the remaining region, to form the N-type contact electrode.

* * * * *

UNITED STATES PATENT AND TRADEMARK OFFICE
CERTIFICATE OF CORRECTION

PATENT NO. : 11,296,257 B2
APPLICATION NO. : 17/004958
DATED : April 5, 2022
INVENTOR(S) : Quan Lyu It is certified that error appears in the above-identified patent and that said Letters Patent is hereby corrected as shown below:

In the Specification

Column 2, Lines 37-41 should be replaced with:
In a possible design, the green-light quantum well structure includes M green-light quantum well layers, and M+1 isolation layers that are used to isolate the M green-light quantum well layers and that are alternately formed with the M green-light quantum well layers, where $M \geq 1$.

Column 16, Lines 23-33 should be replaced with:
In the LED chip shown in FIG. 7, the blue-light quantum well structure in the second sub-pixel structure may include N blue-light quantum well layers, and N+1 isolation layers that are used to isolate the N blue-light quantum well layers and that are alternately formed with the N blue-light quantum well layers, where $N \geq 1$. Similarly, the green-light quantum well structure in the third sub-pixel structure may include M green-light quantum well layers, and M+1 isolation layers that are used to isolate the M green-light quantum well layers and that are alternately formed with the M green-light quantum well layers, where $M \geq 1$.

Column 18, Lines 45-57 should be replaced with:
The substrate may be any one of a sapphire substrate, a Si substrate, a SiC substrate, or a GaN substrate. The buffer layer may be a GaN buffer layer, and a thickness of the buffer layer may be selected from 2 μm to 3 μm. The N-type GaN doping layer may be a GaN layer doped with silicon, and a thickness of the N-type GaN doping layer may be 2 μm to 3 μm. The P-type GaN doping layer may be a GaN layer doped with magnesium, and a thickness of the P-type GaN doping layer may be 150 nm to 300 nm. The charge barrier layer can reduce charge leakage of a sub-pixel structure. For example, the charge barrier layer may be made of Al0.15Ga0.85N, and a thickness of the charge barrier layer may be 15 nm to 35 nm.

Column 23, Lines 24-30 should be replaced with:
After the three colors of light filters are disposed, the drive circuit is connected, and cleavage is performed on the substrate and the buffer layer, a possible structure of the LED chip prepared in the Signed and Sealed this
Twenty-fifth Day of October, 2022

Katherine Kelly Vidal
*Director of the United States Patent and Trademark Office* manner shown in FIG. 15 may be shown in FIG. 18. The LED chip shown in FIG. 18 may be considered as a specific example of the LED chip shown in FIG. 7.